United States Patent [19]
Yamazaki et al.

[11] Patent Number: 5,926,735
[45] Date of Patent: Jul. 20, 1999

[54] METHOD OF FORMING SEMICONDUCTOR DEVICE

[75] Inventors: Shunpei Yamazaki, Tokyo; Naoaki Yamaguchi, Kanagawa; Yuugo Goto, Kanagawa; Satoshi Teramoto, Kanagawa; Katunobu Awane, Nara; Yoshitaka Yamamoto, Nara; Toshimasa Hamada, Nara, all of Japan

[73] Assignees: Semiconductor Energy Laboratory Co., Ltd., Kanagawa-ken; Sharp Kabushiki Kaisha, Osaka, both of Japan

[21] Appl. No.: 08/802,685

[22] Filed: Feb. 19, 1997

[30] Foreign Application Priority Data

Feb. 22, 1996 [JP] Japan .................................. 8-060007
Jul. 1, 1996 [JP] Japan .................................. 8-191541

[51] Int. Cl.$^6$ ............................................. H01L 21/4763
[52] U.S. Cl. .......................... 438/635; 438/701; 438/720
[58] Field of Search .............................. 438/30, 151, 163, 438/305, 307, 635, 640, 701, 720

[56] References Cited

U.S. PATENT DOCUMENTS

| | | | |
|---|---|---|---|
| 5,485,019 | 1/1996 | Yamzaki et al. | 257/57 |
| 5,648,662 | 7/1997 | Zhang et al. | 257/59 |
| 5,736,414 | 4/1998 | Yamaguchi et al. | 438/163 |
| 5,824,235 | 10/1998 | Yamazaki et al. | 216/23 |
| 5,849,611 | 12/1998 | Yamazaki et al. | 438/151 |

FOREIGN PATENT DOCUMENTS 7-310191   11/1995   Japan .
8-203880   8/1996   Japan .

*Primary Examiner*—John F. Niebling
*Assistant Examiner*—Christopher Lattin
*Attorney, Agent, or Firm*—Fish & Richardson P.C.

[57] ABSTRACT

There is disclosed a manufacturing method of highly integrated circuits with thin-film transistors (TFTs) for use as peripheral driver circuitry in active-matrix liquid crystal display (LCD) panel with a pixel array each having a charge transfer control TFT, capable of facilitating formation of contact holes otherwise being difficult in cases where an anode oxide film is formed on gate electrodes of TFTs and lead wires both of which are made of anodizable metal, such as aluminum. The method includes execution of anodization while causing a resist mask to be disposed on part of the lead wire and electrode made of aluminum, thereby partly eliminating formation of the anode oxide film on the lead wire and electrode. At a later step of fabrication, each contact is formed by use of such portion that has no anode oxide film formed thereon. This may allow aluminum to be employed as lead wires while enabling easy fabrication of contacts therefor.

11 Claims, 17 Drawing Sheets

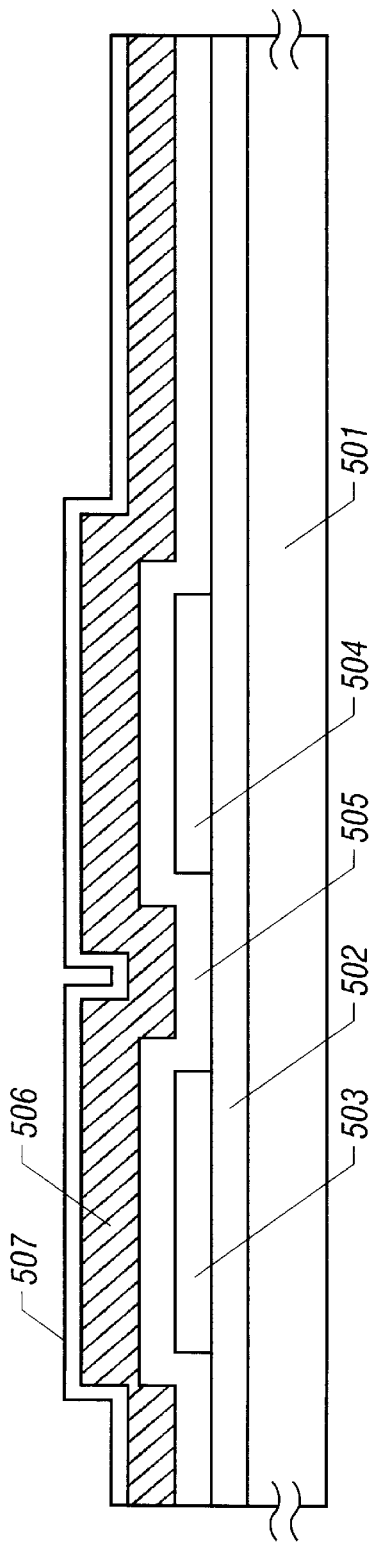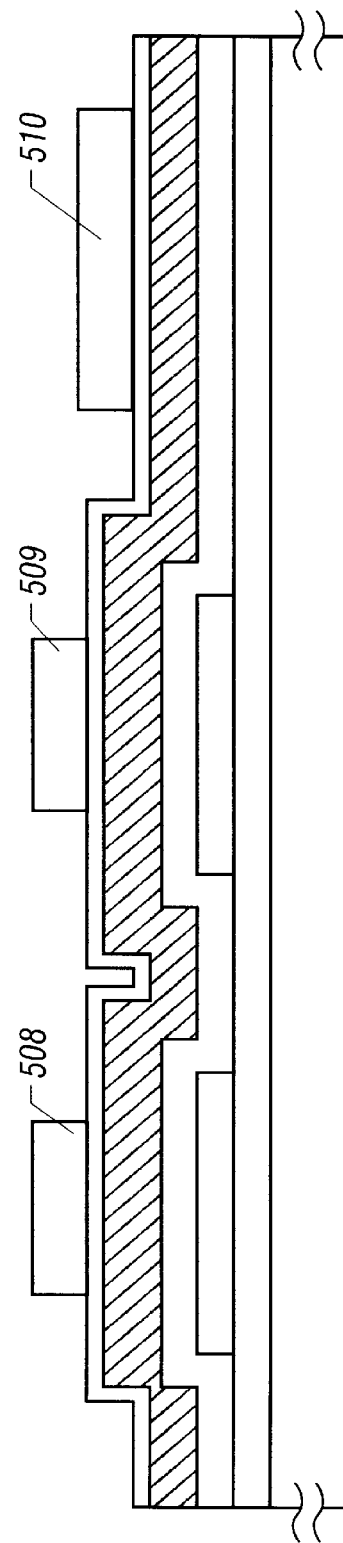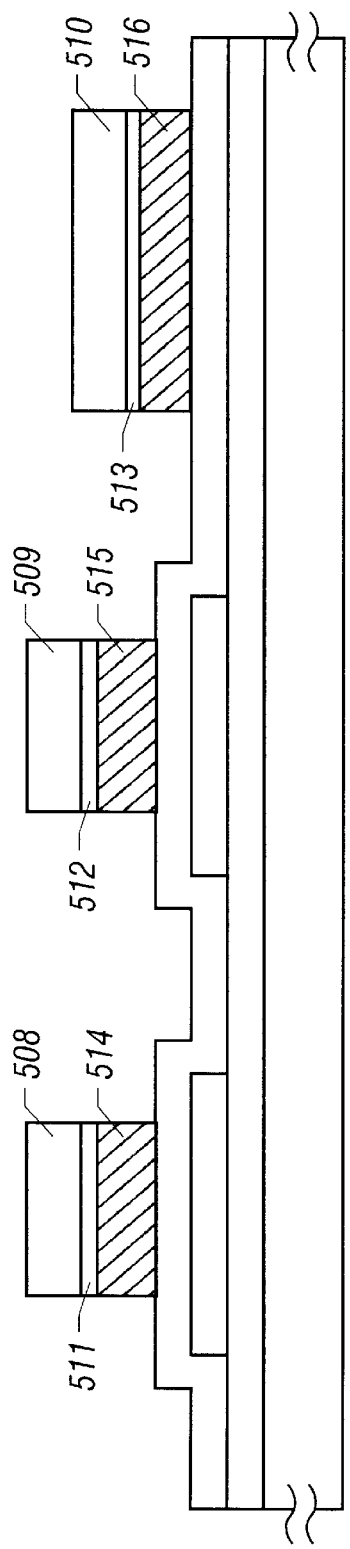
*FIG. 4A*  *FIG. 4B*  *FIG. 4C*

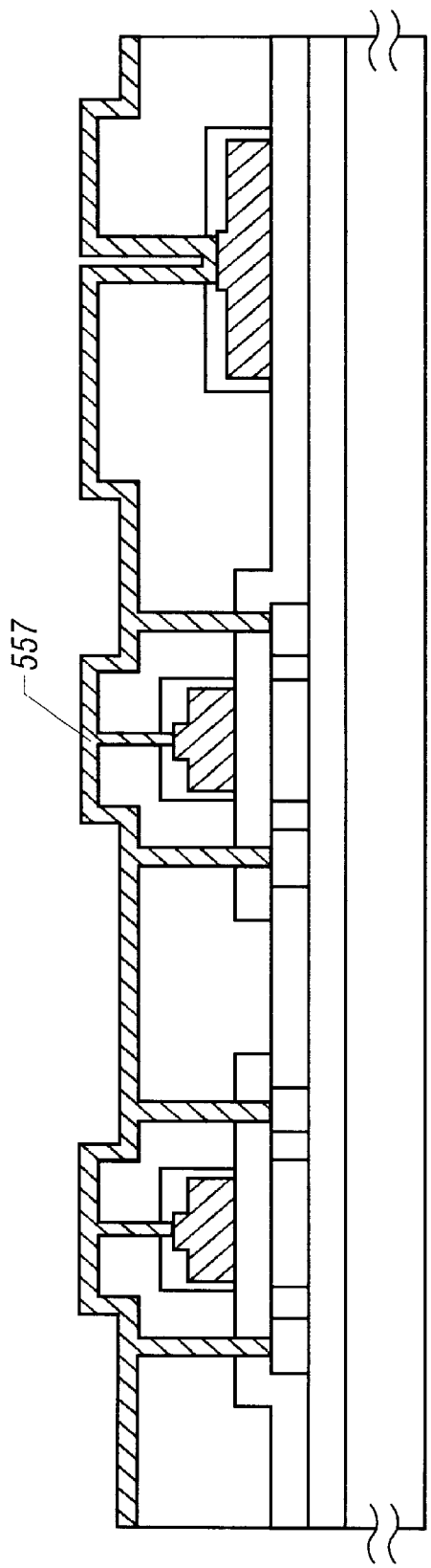
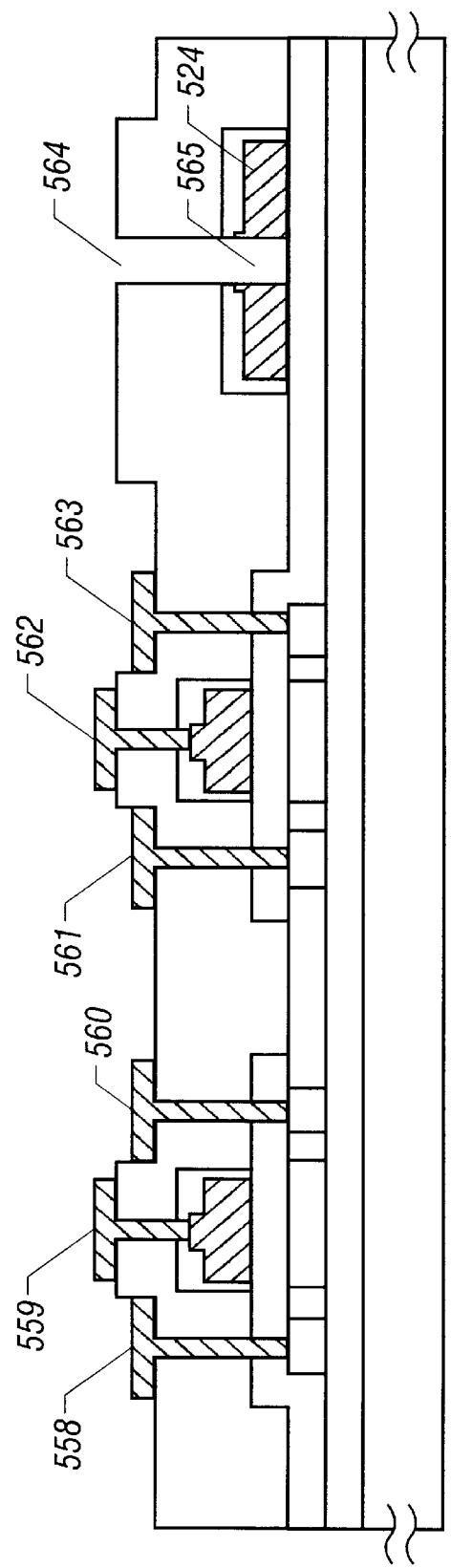
FIG. 4M
FIG. 4N

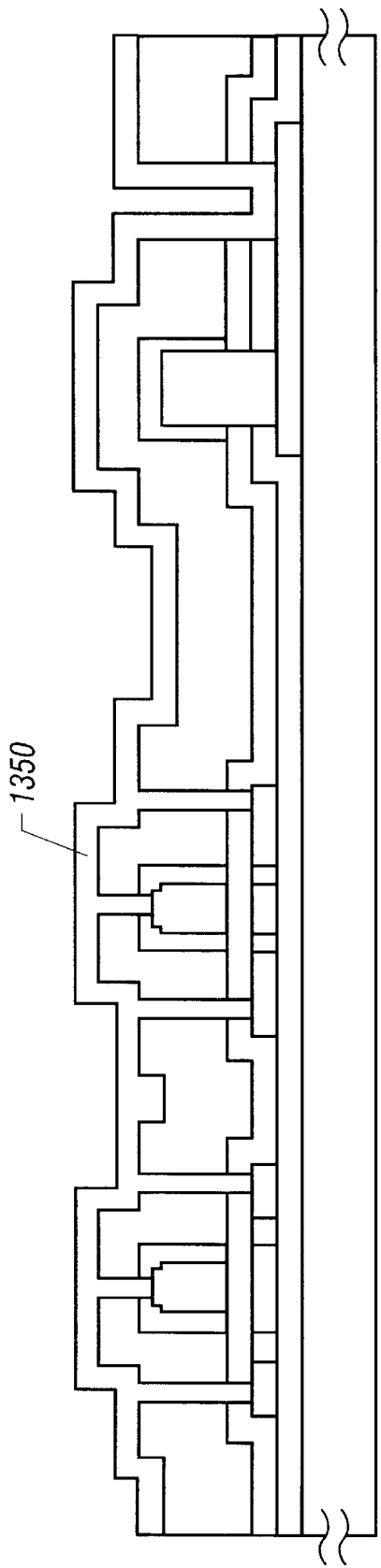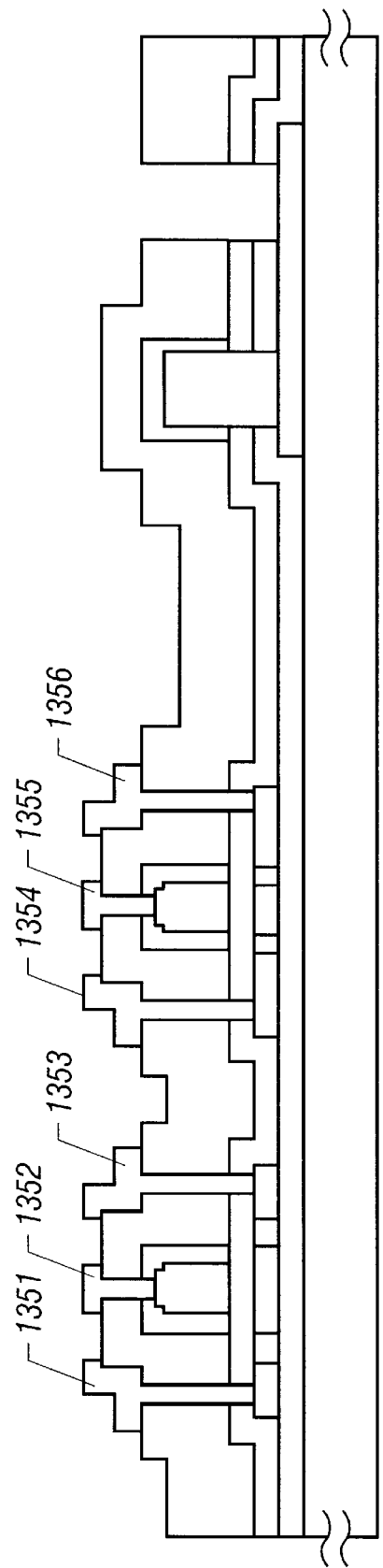
FIG. 7M
FIG. 7N

METHOD OF FORMING SEMICONDUCTOR DEVICE

BACKGROUND OF THE INVENTION

1. Field of the Invention

The present invention relates generally to microelectronics fabrication of semiconductor devices, and more particularly to a method of fabricating highly integrated thin-film transistor structures and associative leads as implemented on a single substrate. The invention also relates to the active-matrix liquid crystal display architecture.

2. Description of the Prior Art

In the fabrication of semiconductor devices such as integrated circuits (ICs) with complementary metal oxide semiconductor field effect transistors (CMOSFETs), successful formation of thin-film transistors (TFTs) on an insulating substrate has been an important goal not only to provide maximized packing density or integration but also to improve certain device performance characteristics, such as operating speed and frequency response. This has been developed until today under the name of the "semiconductor on insulator (SOI)" technology. The SOI technology has become important also for use in reduced-thickness display devices, including currently available active-matrix liquid crystal display (LCD) panels which are becoming important more and more in the manufacture of electronic equipment such as portable or handheld personal computers (PCs), television systems, image processing apparatus, motor vehicle navigation systems, and others.

Highly integrated active-matrix LCD panels come with an increased number of rows and columns of picture elements or "pixels" on an insulative or dielectric substrate, which may be made of glass, quartz, ceramics or the like. A respective one of these pixels includes a TFT which controls transfer of a packet of signal charge to and from an associated pixel electrode as provided therein.

One prior known fabrication of a matrix of LCD pixel TFTs on a single base plate is shown in FIGS. 6A to 6E. See FIG. 6A. As shown, the LCD base plate may be a glass or quartz substrate 11 having a top surface on which a primary coat film 12 is formed by plasma chemical vapor deposition (CVD) or sputtering techniques. An amorphous silicon film (not shown) is formed on coat 12 using plasma CVD or low pressure CVD, and is then crystallized by thermal treatment or laser irradiation to provide a crystalline silicon film (not shown). This silicon film is next patterned forming on substrate 11 a patterned silicon island 13 which will act as the active layer of an intended TFT under manufacture. A silicon oxide film 14 is formed by plasma CVD on the entire top surface of resultant structure, as the gate insulation film of the TFT.

Then, as shown in FIG. 6B, a patterned aluminum island 15 is formed to insulatively overlie the active layer 13. Aluminum island 15 acts as the TFT gate electrode. Gate electrode 15 is elongated from a matrix of associative gate lines on substrate 11. As the LCD increases in screen size, the gate lines increase in length as well to span an extended distance which measures more than several centimeters. An increase in gate-line length results in an increase in electrical resistivity. To attain lower resistivity, it is inevitable to employ low-resistance metallic materials for such gate lines. Typically, low-resistance metals include aluminum, which has been widely used in the manufacture of semiconductor devices due to its commercial availability at low costs.

After formation of the gate electrode 15, resultant structure is put in chosen electrolytic solution and is then subject to anodizing process or "anodization," forming and anode oxide thin film 16 on the exposed top and side surfaces of gate electrode 15 as shown in FIG. 6C. The anodization is carried out with gate 15 being as the anode while a platinum electrode is as the cathode therefor. Anode oxide film 16 may function as a protective layer which physically wraps and electrically isolates aluminum gate 15 from the remaining parts or elements on substrate 11.

As readily recognized by one of ordinary skill in the art to which the invention pertains, accomplishment of low resistivity by use of aluminum does not come without accompanying a conflicting problem: a reduction in thermal or heat resistivity. This problem becomes more serious especially when aluminum is heated during several steps of fabrication, including heat application during annealing and deposition of films as required. This can be said because such lowered heat resistivity can result in creation of hillocks and whiskers, which may refer to undesired crystal projections that resemble in shape spines or needles and badly behave to cause electrical short-circuiting between adjacent lead wires as well as between electrodes. In this respect, forming the anode oxide film 16 is a key to suppressing or eliminating occurrence of such of hillocks and whiskers.

After formation of the anode oxide film 16, a silicon oxide film 17 is deposited by plasma CVD on the surface of resultant structure, as an interlayer dielectric film. Film 17 is patterned forming therein contact holes for making electrical contacts with required parts or elements, involving a contact hole 18 for electrical interconnection with gate electrode 15 as shown in FIGS. 6D and 6E. Forming gate contact hole 18 includes selectively etching away the individual one of interlayer dielectric film 17 and anode oxide film 16, and causing gate 15 (or, a gate lead wire as extended therefrom) to locally expose on its top surface. Here, selective etching removal of anode oxide film 16 raises difficulty in process. Since such film 16 is typically hard in physical nature, accurate selective removal of the same by etching remains difficult, although this hardness, on the other hand, may advantageously serve to enhance the protectability for aluminum electrodes and chip lead wires concerned.

By way of example, consider that the contact hole 18 is formed in the interlayer silicon oxide film 17 using hydrofluoric acid-based etchant such as buffered hydrofluoric acid solution. Imagine that the underlying anode oxide film 16 is successively etched away for formation of an extended portion(s) of contact hole 18 reaching the top surface of gate electrode 15. This approach is encountered with problems which follow. First, anode oxide film 16 is hardly etched away at a selected portion during the etching process; once the contact hole 16 is completed, gate electrode 15 can be overetched to deform significantly as a whole. This can take place due to the fact that aluminum constituting gate electrode 15 is greater in etching speed than aluminum oxides, such as anode oxide 16. Second, while anode oxide 16 remains nonetched, interlayer dielectric film 17 can be laterally overetched at the side walls of contact hole 18. Such excess side-etching results in a decrease in accuracy of device fabrication.

One possible approach to avoid the problems is making use of special kind of etchant capable of selectively etching away aluminum oxides only, such as the anode oxide film 16. Chromium-mixed acid is one example. This acid is solution containing therein a mixture of phosphoric acid, acetic acid and nitric acid as added with chromium acid. Unfortunately, this approach is encountered with another serious problem: A passivated film (film of passive state) can be formed on the surface of aluminum islands. To successfully remove such passivation film (film of passive state) from aluminum, it should be required that a further etching process be carried out by use of hydrofluoric acid-based etchant, increasing complexity and costs for manufacture. Another disadvantage of the approach is that it is very difficult to retain expected etching effect. This is due to increased variations in composition of materials resulting from execution of etching treatments using chromium acid. From the foregoing, it can be seen that prior known approaches to form contact holes in anode oxide films are faced with several serious problems and difficulties.

On the other hand, in order to successfully perform anodization process, it has been strictly required that all of the subject electrodes and/or lead wires be electrically coupled to one another at any events during fabrication. Another strict requirement is that after completion of such anodization, these lead wires are capable of being cut into parts for electrical interruption at appropriate stage of the fabrication process. This lead-cut or separation also accompanies with similar problems as raised due to the difficulty of removal of anode oxides by selective etching. Furthermore, if the lead-cut process is to be done independently at a step of fabrication then complexity increases accordingly.

SUMMARY OF THE INVENTION

It is therefore an object of the present invention to provide a new and improved process for forming semiconductor devices capable of avoiding the problems faced with the prior art.

It is another object of the invention to provide an improved scheme capable of facilitating formation of contact holes in anode oxide films overlying metal parts of semiconductor devices.

It is a further object of the invention to provide an improved approach capable of overcoming difficulties of electrical separation of lead wires by use of anodization techniques while reducing complexity in the manufacture of semiconductor devices.

To attain the foregoing objects, the present invention provides a specific process of forming a device structure with electrodes and associated lead wires both of which are made of aluminum each having an anodized surface as covered by an anode oxide film formed thereon, which structure is capable of avoiding difficulties in formation of contact holes therefor. More specifically, a mask is placed in advance at certain selected locations on the electrode/lead surface at which the anode oxide film is to be later formed. After formation of such mask, anodization is then carried out thereby selectively eliminating formation of any anode oxide film at specific portions at which contact holes are to be defined later. With such an arrangement, it becomes possible to avoid or minimize difficulty of contact-hole formation otherwise arising due to inherent difficulty of removing such anode oxide film. Electrical separation process being later performed after the anodization is executed by use of the prescribed certain portions on which the anode oxide film was not formed selectively. This separation is carried out during a separation step by forcing relevant portions of the aluminum lead wires to be etched away along with contact-hole leads and electrodes concerned. This may enable successful achievement of the foregoing objects without having to increasing complexity in the manufacture of semiconductor devices required.

In accordance with one aspect of the instant invention, a method of forming semiconductor devices includes the steps of performing anodic oxidation or anodization with a mask being disposed on part of an conductive island pattern which may include either one of a lead wire and an electrode as made of chosen anodizable metal that can be easily anodized, and forming a contact hole for the metal island by use of the part underlying the mask while allowing the island to be cut into parts for electrical separation if required. Very importantly, while locally eliminating formation of any anode oxide film by making use of the mask overlying the selected surface area in which a contact hole is to be defined later, such surface area is then utilized to perform both formation of an intended contact hole and separation of the island at a time. In other words, the formation of electrical interconnection pad electrodes associated with the contact holes and the island separation are carried out substantially simultaneously by use of the surface portions which have not been subjected to the selective anodization. This makes it possible to successfully provide intended contact holes that extend through the anode oxide film while maximizing the inherent technical advantage as originated from employment of aluminum films in semiconductor devices. It also becomes possible to attain successful cut-away separation process of related metal portions, such as leads for electrical interconnection, without the necessity of increasing in number extra steps of manufacture.

In accordance with another aspect of the invention, a method of forming semiconductor devices includes selectively forming an anodic oxide film on a surface of at least one of a lead wire and an electrode made of an anodizable metallic material, and forming a contact hole for electrical interconnection with at least one of the lead wire and the electrode by use of part thereof while permitting cut-away separation of at least one of the lead wire and the electrode.

In accordance with a still another aspect of the invention, a method of manufacturing semiconductor devices includes forming a film of an anodic oxidative material, forming an anode oxide film on the film, forming by deposition a first mask on the anode oxide film, forming using the mask a predefined lead wire and/or certain pattern of electrode, removing the first mask, forming by deposition a second mask on part of at least one of the lead wire and/or electrode thereby performing anodic oxidation, and forming a contact hole for electrical interconnection with at least one of the lead wire and the electrode by use of the part underlying the second mask while simultaneously permitting cut-away separation of one or both of the lead wire and the electrode.

In accordance with a further aspect of the invention, a method of manufacturing semiconductor devices includes forming a pattern of anodizable material having a surface on which a thin anode oxide film is formed, and simultaneously performing formation of a contact and separation of the pattern by use of such thin portion of the anode oxide film.

These and other objects, features and advantages of the present invention will be more readily understood and apparent from the following detailed description of the invention, which should be read in connection with the accompanying drawings.

DETAILED DESCRIPTION OF THE EMBODIMENTS

Figure 1A:
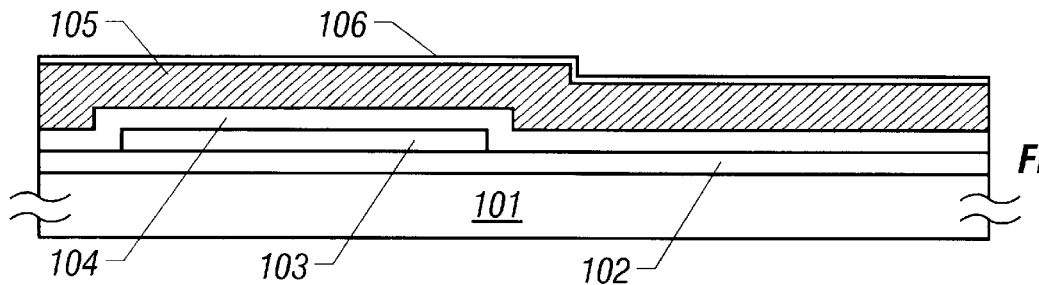
FIGS. 1A to 1J illustrate, in cross-section, some of the major steps of manufacture of a semiconductor device in accordance with one preferred embodiment of the invention.

A fabrication method of thin-film transistors (TFTs) in accordance with one preferred embodiment of the present invention will be fully described with reference to FIGS. 1A through 1J (not drawn to scale). It will be apparent from the following description that the method includes a step of forming lead wires each extending from an associated TFT gate electrode, and a step of cut-away separation thereof. The lead wire herein may be a current-carrying lead for power feed as used during anodization process.

TFTs as formed by the method shown in FIGS. 1A–1J may preferably be for use as peripheral driver circuitry in active-matrix liquid crystal display (LCD) devices. One exemplary configuration of driver circuitry is shown in FIGS. 2 and 3, wherein FIG. 2 depicts a plan view of a major part of the LCD driver circuitry whereas FIG. 3 shows a corresponding equivalent circuit configuration thereof. The illustrative LCD driver circuitry employs therein a two-stage coupled configuration of complementary combinations of P- and N-channel metal oxide semiconductor field effect transistors (MOSFETs) each having the TFT structure shown.

More specifically, as shown in FIG. 2, the numeral 406 designates the active layer of an N-channel TFT (NTFT) whereas numeral 407 denotes that of a P-channel TFT (PTFT). A lead wire 403 extends from associative gate electrodes of all the TFTs used herein. A portion as enclosed by dotted line block 405 acts as an output of a first stage, or prestage, of the complementary driver circuit; a portion 404 is an output of a second or post-stage thereof.

In the circuitry of FIGS. 2 and 3, an anodizing process, or anodization, is carried out with current being supplied from the lead 403 as extended from the gate electrodes. However, it should be required in the form of finally completed integrated circuit structure having the TFTs that extra or "dead space" portions be defined for separation or segmentation of a conductive layer by patterning into a plurality of individual TFT gate electrodes required. Such "element separation/segmentation" locations on the substrate surface are indicated by numerals 401, 402 in the planar view of FIG. 2.

In this respect, a series of cross-sectional structures as depicted in FIGS. 1A–1J each correspond to a sectional view of the active layer 406 of NTFT shown in FIG. 2 as taken along line B—B' as well as the same of the lead 403 along line A—A' of FIG. 2.

Figure 2:
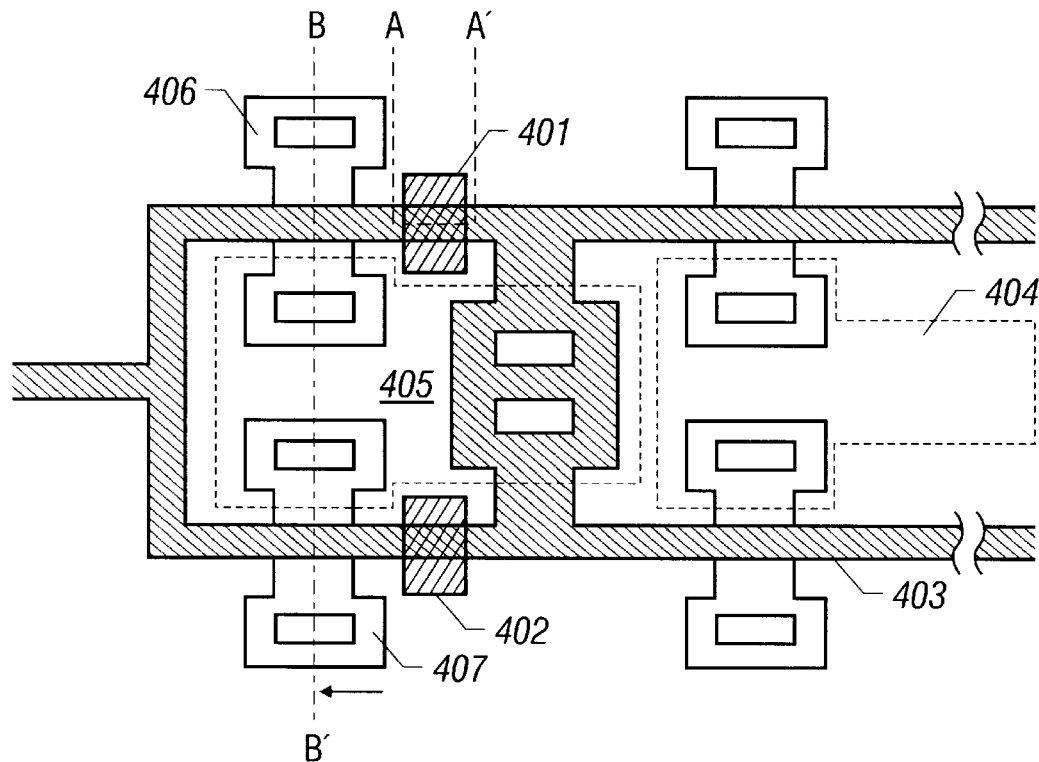
FIG. 2 depicts a planar pattern of resultant semiconductor device as fabricated by the method embodying the invention.
Figure 3:
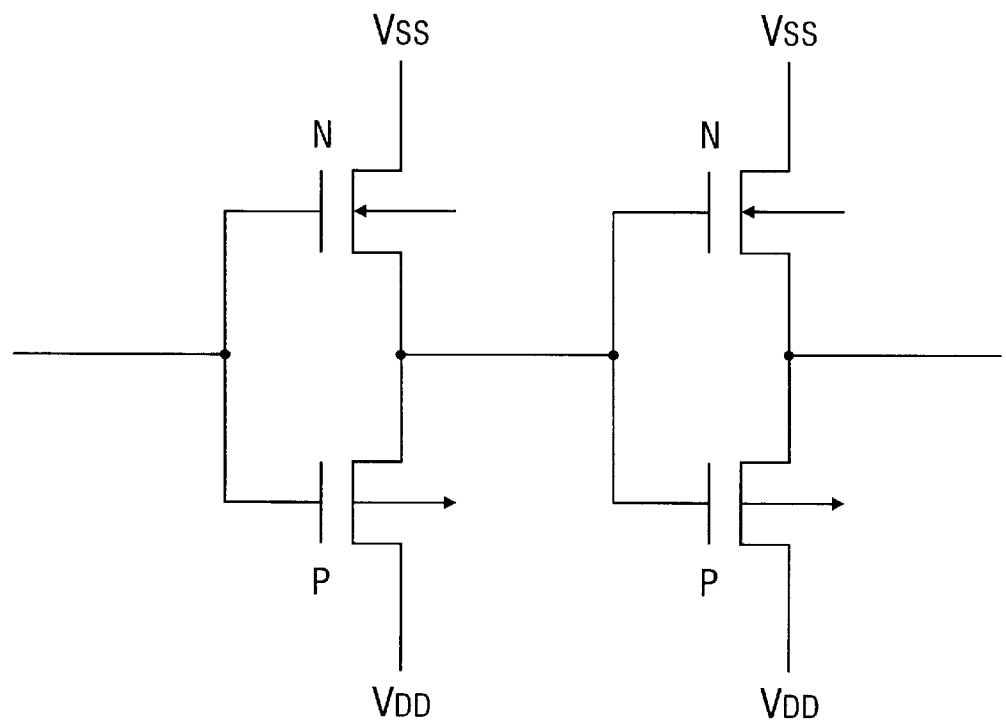
FIG. 3 shows a configuration of electrical circuitry thereof.

Referring first to FIG. 1A, an insulating substrate 101 has a top surface on which a TFT and a lead wire are to be formed, wherein the former placed at the left-hand location corresponds to the line B—B' cross-section of FIG. 2 whereas the latter is at the right-hand location thereon and corresponds to the A—A' profile. The insulating substrate 101 may be made of chosen dielectric materials, including glass, quartz, ceramics or the like. Use of non-alkaline glass, such as commercially available "Corning 1737" glass, may be recommendable.

As shown in FIG. 1A, a primary coat layer 102 is deposited by plasma chemical vapor deposition (CVD) or sputtering techniques to a predetermined thickness, such as 30 nanometers (nm), on the surface of the glass substrate 101. It is required that coat layer 102 be hard and dense in physical nature; in this sense, coat 102 may be a silicon oxide film, silicon oxynitride film or the like.

After deposition of the coat 102 on substrate 101, a silicon film is formed thereon which will later constitute the active layer of an intended TFT structure. Formation of the silicon film is as follows: Form an amorphous silicon film (not shown) by low pressure thermal CVD or plasma CVD techniques to a target thickness, for example 100 nm; then, heat resultant structure at a predefined temperature for crystal growth or crystallization of the amorphous silicon film. Preferably, resultant structure is irradiated with a laser beam for further facilitation or acceleration of crystallization improving the crystallinity thereof. Whereby a crystalline silicon film (not shown) is obtained. Then, patterning is performed forming an island 103 on glass substrate 101. Island 103 acts as the active layer of a later-fabricated TFT structure. Note that while the illustrative embodiment is designed to execute patterning-formation of the TFT active layer 103 after the thermal crystallization of the amorphous silicon film mentioned, the present invention should not exclusively be limited thereto; alternatively, the crystallization may be done after the patterning-formation of TFT active layer 103 by thermal treatment or by irradiation of a laser beam. Still alternatively, such laser-beam irradiation may be carried out after patterning of the thermally recrystallized crystalline silicon film.

Next, a dielectric thin film 104 is formed of silicon oxide by plasma CVD on the surface of substrate 101 overlying the active layer 103. Dielectric film 104 measures 100 nm in thickness. Film 104 serves as the gate insulation layer of a later-completed TFT structure, and may be made of silicon oxynitride. A conductive or metallic film 105 of 500-nm thick is then formed by sputtering on gate insulation film 104. Film 105 is for use in forming a desired pattern of electrical interconnection lead wires as extended from and electrically coupled to an associative TFT gate electrode(s). Film 105 may be made of chosen anodizable metal, such as aluminum. Aluminum film may contain scandium at 0.1 weight percent (wt %). This is to suppress or eliminate occurrence of unwanted hillocks or whiskers due to abnormal growth of aluminum during heat treatments to be performed at later stages of manufacture. It is readily recognized by one of ordinary skill in the semiconductor art that the hillocks or whiskers may refer to any possible needle- or spine-like projections resulting from abnormal or undesired growth of aluminum.

After growth of the aluminum film 105, resultant structure is put in electrolytic solution for anodization with film 105 being as the anode therefor. During this anodizing process an extremely thin anode oxide film 106 is formed on the top surface of the structure as shown in FIG. 1A. The electrolytic solution here is ammonium-neutralized ethylene glycol solution containing therein tartaric acid at 3%. The anodization is carried out by use of aluminum film 105 as the anode whereas platinum as the cathode while simultaneously allowing current to flow therebetween. Anode oxide film 106 as formed during this anodization exhibits an increased density in nature, and is principally controllable in thickness by potentially adjusting voltages as externally applied thereto. The thickness of anode oxide film 106 here ranges from 10 to 15 nm. This thickness value may be suitably determined depending upon the settings of process parameters for later steps of fabrication; generally, it will be preferable that the thickness of film 106 is as small as possible. This can be said because of the fact that a reduction in thickness of film 106 may facilitate easy removal of such film 106 thereafter. Film 106 is expected to play an important role for increasing or enhancing the adhesive property of a photosensitive resist mask layer to be later formed thereon. In this respect, it is preferable that film 106 is less in thickness insofar as it comes without accompanying with any reduction in adhesionability with resist masks used. It will also be important that the setting of such reduced thickness for anode oxide film 106 functions to eliminate or minimize any undesired formation of a porous anode oxide film at unintended locations during later-performed selective formation of such porous film. In this way, the structure of FIG. 1A is obtained.

Figure 1B:
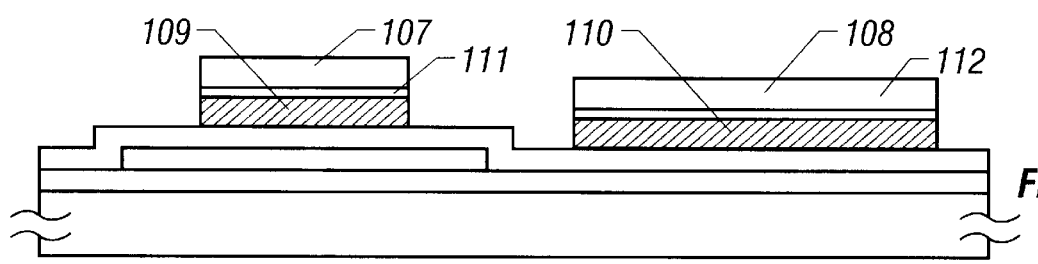

Then, as shown in FIG. 1B, patterned photosensitive resist mask segments 107, 108 are formed on the top surface of the resulting structure of FIG. 1A. During formation of these masks 107, 108, presence of the anode oxide film 106 may successfully contribute to enhancement of the adhesionability between aluminum film 105 and resist masks 107, 108. Patterning process is then carried out by use of masks 107, 108 thereby to define a desired planar pattern of aluminum islands 109, 110 on film 104 as depicted. Note here that these islands 109, 110 are illustrated as if these were spaced apart and separated from each other; however, one is extended from and coupled with the other at certain location that is not visible in FIG. 1B so that they remain substantially identical in potential to each other.

Figure 1C:
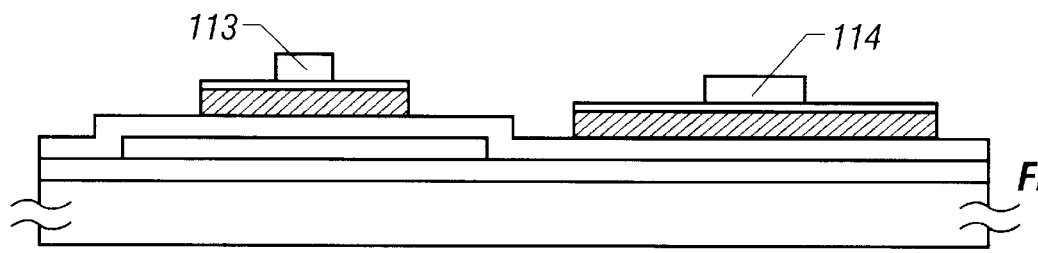

Then, as shown in FIG. 1C, the resist masks 107, 108 are removed away by use of chosen release/exfoliation accelerator solution. New resist mask segments 113, 114 that are less in width than masks 107, 108 are then deposited on the top surface of patterned aluminum islands 109, 110 as shown. Each mask 113, 114 may alternatively have a multilayered structure consisting of an appropriate resin material and resist mask laminated on each other. Mask 113 is formed at a specific location at which one of contact holes will be defined for electrical interconnection with a gate electrode during a later step of fabrication; mask 114 is disposed at a location whereat a chip lead extended from the gate electrode (a lead wire for supply of an anodization current during anodization) will be cut into parts at a later step. In this way the structure of FIG. 1C is obtained.

Next, the structure of FIG. 1C is again subject to the anodization process with the patterned aluminum islands 109, 110 being as the anode therefor. In the illustrative embodiment the electrolytic solution used here is aqueous solution of 3%-oxalic acid. During this anodization process, porous anode oxides 115, 116 are formed on the opposite side walls of aluminum islands 109, 110. The use of the term "film" may not be appropriate for these side-wall oxides 115, 116. Selective formation of side-wall oxides 115, 116 is due to the presence of dense anode oxide films 111, 112 overlying islands 109, 110 as shown in FIG. 1D.

The structure of FIG. 1D is again anodized using ammonium-neutralized ethylene-glycol solution containing therein tartaric acid at 3% to ensure that such anodization is performed under the condition permitting formation of an anode oxide film with a maximized density. The anodization here also uses the aluminum islands 109, 110 as the anode while platinum is as the cathode.

Figure 1D:
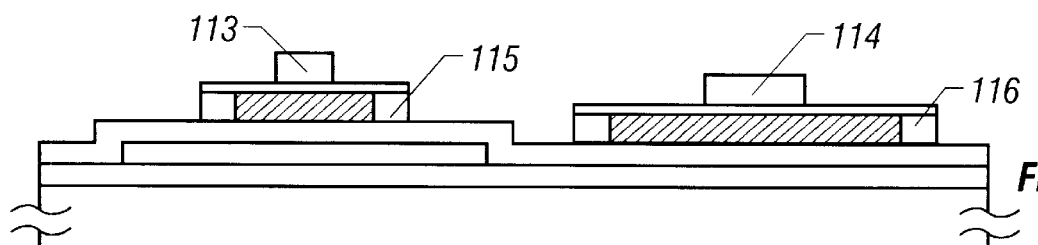

During the further anodization process at the step of FIG. 1D, anodizing action progresses while allowing the electrolytic solution to enter and fill the inside of the porous anode oxides 115, 116. Hence, the anodization causes the dense anode oxide films 111, 112 to increase in thickness at the top surface of the aluminum islands 109, 110; on the side walls of islands 109, 110, anode oxide films 120, 119 having a dense film quality are formed inside the anode oxide films 115, 116. No anode oxide films are formed at the lower portions of resist masks 113, 114 due to the fact that the electrolytic solution is incapable of entering thereinto. Accordingly, dense anode oxide films of 10 to 15 nm thick reside at there. Anode oxide films 120, 119 measure 100 nm in thickness. This thickness may be attained by potentially controlling an externally applied voltage to fall within a range of 70 to 80 volts. The thickness of such anode oxide films may be set to range from 70 to 150 nm. As a result of this, dense anode oxide films 111, 112 become integral during this process with the additionally formed anode oxide films 120, 119 respectively, as shown in FIG. 1E.

Note here that the anodization current flowing during the above anodization is supplied via the aluminum island 110 acting as the lead wire, as mentioned previously. The anodization current is also fed from lead 110—or, from its equivalent lead as disposed in a different substrate area—to the gate electrode of other TFT sections (not shown) as integrated on the substrate 101. An anode oxide film is also formed on the anodization current-supplying lead island 110 per se. In this respect, a resultant profile of lead 110 after formation of such anode oxide film is designated by numeral 118 for clarity purposes as shown in FIG. 1E.

Figure 1E:
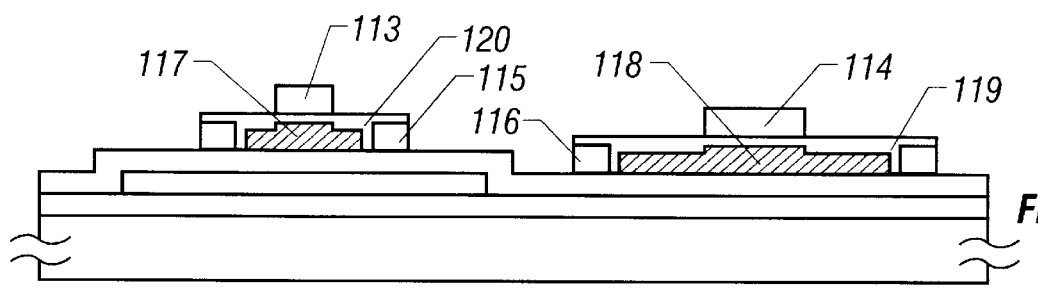
Figure 1F:
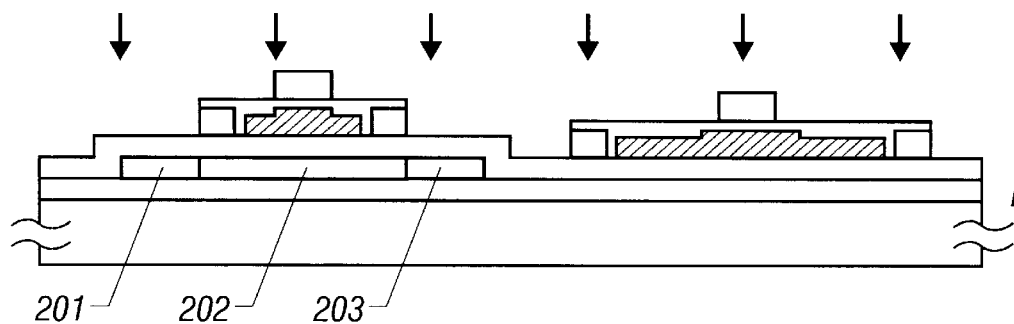

Next, as shown in FIG. 1F, the structure of FIG. 1E is doped with an impurity of N type-here, phosphorus (P) ions for fabrication of N-channel TFTs. Plasma doping techniques may be preferable. This ion doping process is done under selected conditions that permit implantation of P ions at an increased concentration. As a result of such ion doping, heavily-doped impurity regions 201, 203 are formed in the active layer 103 in such a manner that these are self-aligned with the overlying gate structure having the side-wall anode oxides 115 as shown, while allowing an intermediate region between regions 201, 203 to remain non-doped.

Then, the resist masks 113, 114 are removed away using chosen stripping agent or releasant. Next, the porous anode oxide films 115, 116 are removed by use of chosen etchant of a mixture of acetic acid, phosphoric acid and nitric acid. Note here that part of anode oxide films 120, 119 in the area in which masks 113, 114 have been placed will possibly be etched away since such part is relatively less in thickness than the others. If this is the case, extra oxidization may be carried out after removal of masks 113, 114 causing the possibly thinned anode oxide films 111, 112 to increase in thickness accordingly.

Figure 1G:
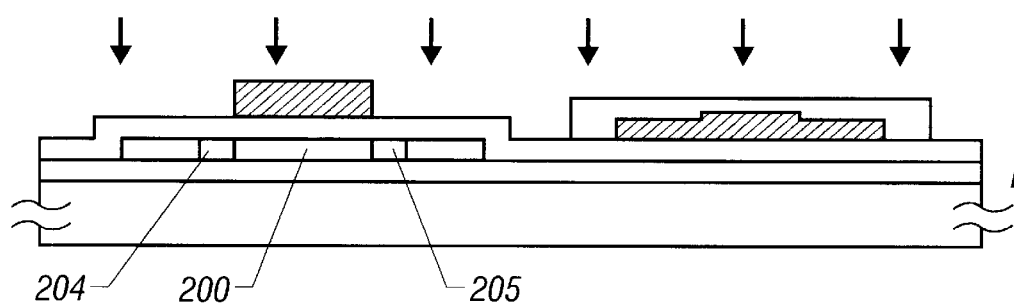

Removal of the masks 113, 114 as well as porous anode oxide films 115, 116 results in the structure of FIG. 1G, which is then doped or implanted with phosphorus (P) ions again. This ion doping is different in impurity charge dose from the prior doping process at the step of FIG. 1F; more specifically, the former is less in charge dose than the latter, permitting resultant impurity-doped regions at a lower concentration. As a result of such low-dose ion doping, narrow lightly-doped regions 204, 205 are defined in the TFT active layer 103 at inner edges of spaced-apart peripheral heavily-doped regions 201, 203 therein; simultaneously, a channel formation region 200 is defined at an intermediate location therebetween in active layer 103 as shown in FIG. 1G.

After formation of the lightly-doped regions resultant structure is then irradiated with a laser beam to activate the doped impurity (P ions) and to cure by annealing any possibly damaged semiconductor layer portions due to the impurity doping process. In this way, a source region 201, drain region 203 and lightly-doped regions 204, 205 are formed such that they are self-aligned with the overlying gate structure. Simultaneously, a channel formation region is defined in active layer 103 in self-alignment with it. Here, one lightly-doped region 205 near the drain region 203 is a specific region that serves to constitute what is called the "lightly-doped drain (LDD)" structure.

Figure 1H:
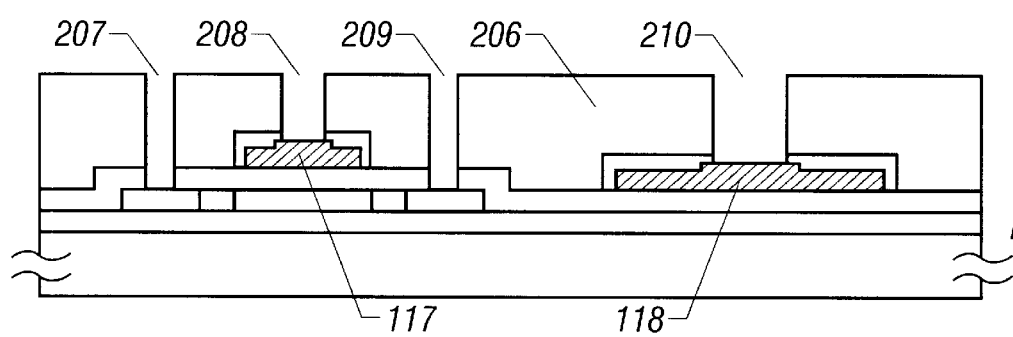

Next, as shown in FIG. 1H, an interlayer dielectric film 206 is deposited on resultant structure. Film 206 may be a multilayered insulator that consists of a silicon nitride film as formed by plasma CVD techniques to a predetermined thickness, such as 200 nm, and an overlying silicon oxide film formed using similar deposition techniques. Then, dielectric film 206 is patterned defining therein a plurality of contact holes. These contact holes include source and drain contact holes 207, 209 for making electrical interconnections with the source and drain regions 201, 203, respectively. Vertically elongated openings 208, 210 are also defined in film 206: the former 208 is for electrical contact with the gate electrode 117 whereas the latter 210 is for a chip lead wires 118 which is extended from and electrically coupled to gate electrode 117. Opening 208 acts as a gate contact hole; opening 210 functions as a "lead-cut separator" for cutting the lead 118 into separate parts to insure electrical isolation. Defining such contact holes or openings is carried out by use of hydrofluoric acid-based etchant, such as buffered-hydrofluoric acid, by way of example. During this etching process, required contact holes are first defined in interlayer dielectric film 206; thereafter, the openings are formed in the extra thin anode oxide films 111, 112 overlying gate islands 117, 118. Since such anode oxide films are less in thickness, etching process can be successively progressed using the hydrofluoric acid-based etchant in such a way that this is continued from the etching treatment of interlayer dielectric film 206 in a "seamless" fashion, enabling formation of openings 208, 210 which are deep enough to reach the top surface of gate electrode 117 and that of lead 118 as shown in FIG. 1H.

The structure of FIG. 1H is then formed with a metallic layer(s) for use in providing electrodes and/or chip leads on the top surface thereof. A sputtering technique is employed here to form thereon a multilayered metal film 211 which consists of a lamination of three separate conductive films: a titanium film, aluminum film, and titanium film. When appropriate the film 211 may alternatively be made of a single conductive layer. A resultant structure is as shown in FIG. 1I.

Figure 1I:
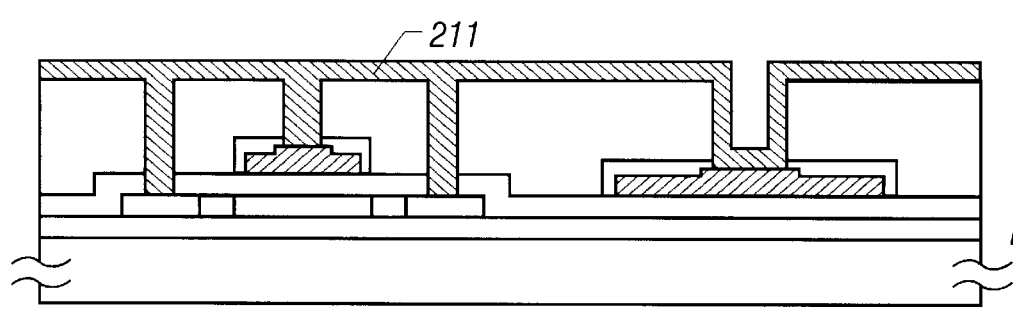
Figure 1J:
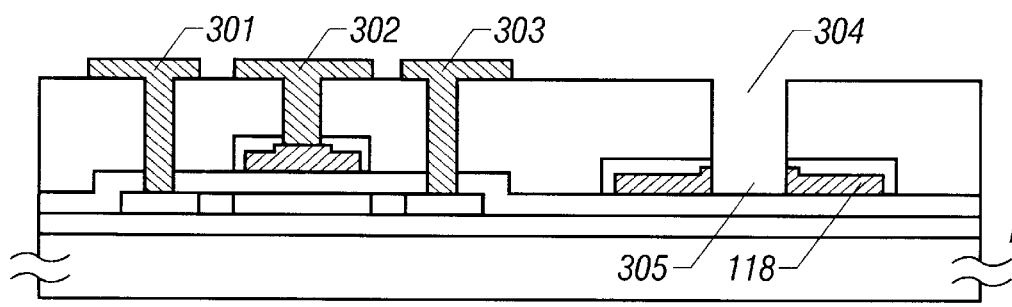

The structure of FIG. 1I is then subject to a patterning process of the multilayered metal film 211, thus defining several pad islands, including a source electrode 301 electrically coupled to the underlying source region 201, a pad 302 coupled to the gate electrode 117 (or gate lead wire), and a drain electrode 303 as shown in FIG. 1J. During formation of these electrode pads 301–303, unnecessary portions of metal 211 on or around the opening 210 associated with the underlying lead wire 118 are removed away together with corresponding part of lead 118 which extends continuously from opening 210, thereby defining a vertically extended opening 304 as shown. More specifically, during the selective etch-out patterning of metal 211 at the bottom of opening 210 of FIG. 1H, the etching treatment is forced to further progress at completion of such metal etching, allowing the central portion of aluminum lead 118 to be removed away by etching. With such an arrangement, as can be seen from FIG. 1J, metal lead 118 can be successfully cut off or interrupted at the center location of opening 304 as indicated by numeral 305 herein. This lead-cut section 305 may correspond to the element separation/segmentation locations 401, 402 shown in FIG. 2.

With the illustrative fabrication method of FIGS. 1A to 1J, it becomes possible to ease or avoid any possible difficulties of forming openings that elongate through the anode oxide film as required where aluminum is used for electrodes and leads of the TFT structure. Another advantage of this embodiment lies in the capability of reducing complexity and cost of manufacture by forcing both the selective cut/interruption process of a lead(s) for use in anodization and the patterning process of electrodes and lead wires to be done at a time.

A fabrication method of a CMOS structure in accordance with another embodiment of the invention is shown (not drawn to scale) in FIGS. 4A through 4N, which structure has an insulating substrate, such as a glass substrate, with P- and N-channel TFTs being formed on its top surface. The proposed structure will be preferably for use in forming CMOS peripheral driver circuitry that is operatively coupled to a pixel array of active-matrix liquid crystal display (LCD) panels. Note that the depiction of each of FIGS. 4A–4N assumes that an N-channel TFT (NTFT) and a P-channel TFT (PTFT) are on the left side thereof for purposes of explanation only. Note also that the right side structure may correspond to a cross-section as taken along line A—A' shown in FIG. 2 whereas the left side structure to a cross-section along line B—B' of FIG. 2.

As shown in FIG. 4A, a dielectric substrate 501 which may be made of glass, ceramics or the like has a surface on which a primary coat layer 502 is deposited to a predetermined thickness, such as 300 nm. Coat 502 may be a silicon oxide film. Then, an amorphous silicon film (not shown) is formed on coat 502 by plasma or low-pressure CVD techniques to a thickness of 100 nm, for example. This film may act as a starter film for crystal growth of a crystalline semiconductor film for constituting the active layers of finally fabricated TFTs. Resultant structure is next heated or irradiated with a laser beam for crystal growth or crystallization of the amorphous silicon film, forming a crystalline silicon film (not shown). This film is then patterned defining therein TFT active layers 503, 504. Active layer 503 is for the PTFT whereas active layer 504 for NTFT. A silicon oxide film 505 is deposited by plasma CVD techniques to a thickness of 100 nm on the top surface of resultant structure with active layers 503, 504. Film 505 will serve as the gate insulation layer for TFTs. An aluminum film 506 is deposited by sputtering on gate insulation film 505 to a predefined thickness, for example, 500 nm. Aluminum film 506 will act as the gate electrode of each TFT. Film 506 may contain therein scandium at 0.1 weight percent (wt %) for suppression or elimination of undesirable occurrence of hillocks and/or whiskers. A dense anode oxide film 507 is further formed on film 506 to a thickness of 5 to 10 nm as shown in FIG. 4A.

As shown in FIG. 4B, a photosensitive resist layer is deposited covering the entire top surface of the structure of FIG. 4A and is then patterned forming mask segments 508, 509, 510 as shown. These mask segments are for use in forming by patterning of the aluminum film 506, gate electrodes and associative gate lead wires as extended therefrom. The presence of the anode oxide film 507 with an increased density may enhance adhesion strength of masks 508–510 with respect to the underlying aluminum film 506.

As shown in FIG. 4C, the aluminum film 506 is patterned with the masks 508–510 being as a mask, thereby defining several spaced-apart islands each of which consists of a lower aluminum 514 (515; 516), an intermediate extra-thin, dense anode oxide 511 (512; 513), and an upper resist 508 (509; 510) as laminated on film 505 in this order. In the two left-side islands, each lower aluminum pattern 514, 515 is the base layer for the gate electrode of a corresponding TFT structure—that is, aluminum 514 for the PTFT whereas aluminum 515 for NTFT. The aluminum base of the remaining island is part of a lead wire for use in supplying an anodization current during a later anodization process, which wire is extended from and electrically coupled to the former TPT gate electrodes. The structure as depicted herein may correspond to respective cross-sections of the planar arrangement of the circuit configuration shown in FIG. 2. More specifically, the two active layers 503, 504 correspond to those 407, 406 of the PTFT and NTFT of FIG. 2.

Figure 4D:
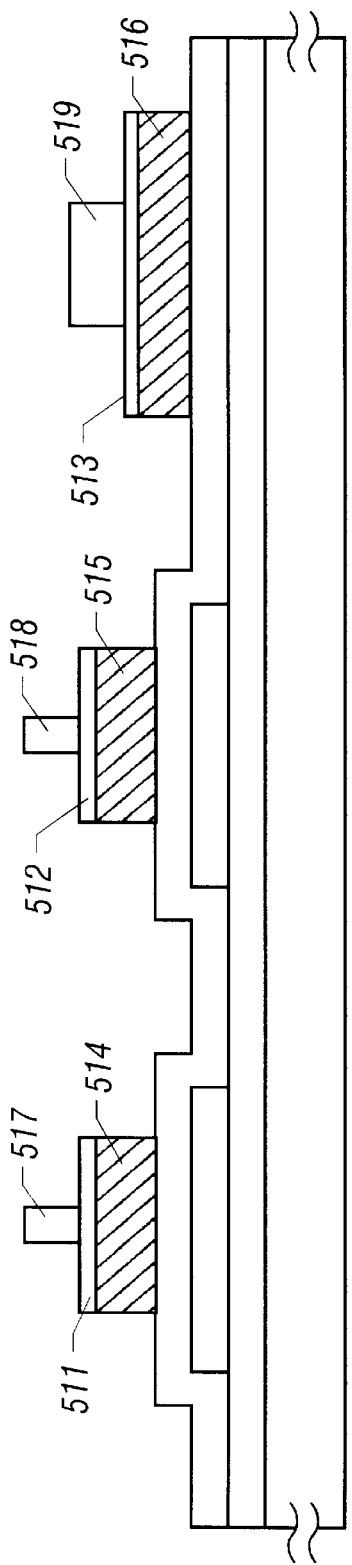
FIGS. 4A to 4N illustrate, in cross-section, some of the major steps of manufacture of a semiconductor device having P- and N-channel type thin-film transistors (TFTs) on a single substrate in accordance with another embodiment of the invention.

After removal of the overlying masks 508–510, another photosensitive resist film is deposited on the entire top surface of resultant structure as shown in FIG. 4D, in which film several narrow patterned mask segments 517, 518, 519 are placed on the gate islands 514, 515 and lead island 516. The gate mask segments 517, 518 are to determine certain locations whereat gate-electrode contact holes are to be defined. This will be done at a later step due to the fact that the presence or coverage of such masks 517, 518 attempts to prevent formation of any additional dense anode oxide films on the top surface of gate islands 514, 515 allowing required contact holes to be defined at there. The lead mask 519 is for later use in cutting or interruption of a lead wire (as indicated by numeral 524 in FIG. 4E). In other words, the location of mask 519 determines the exact lead-cut position.

Figure 4E:
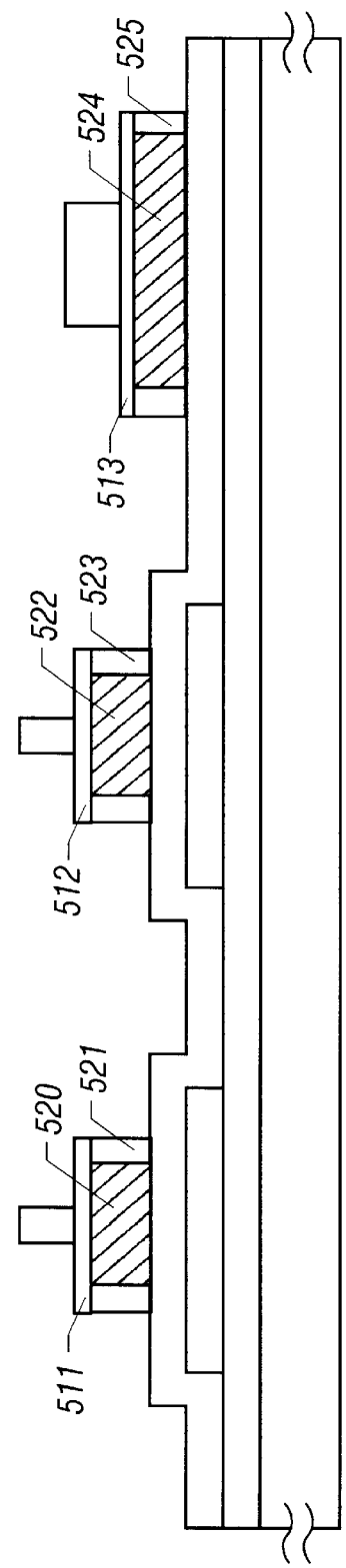

Then, as shown in FIG. 4E, porous anode oxides 521, 523, 525 are selectively formed on the side walls of islands 514–516, respectively. During this anodization process, an anode oxidizing (anodization) current is supplied via the lead wire 524. The presence of dense anode oxide films 511–513 eliminates formation of additional porous anode oxides on the top surfaces of respective aluminum islands 514–516. This results in fabrication of gate electrodes 520, 522 of PTFT and NTFT as shown in FIG. 4E.

Figure 4F:
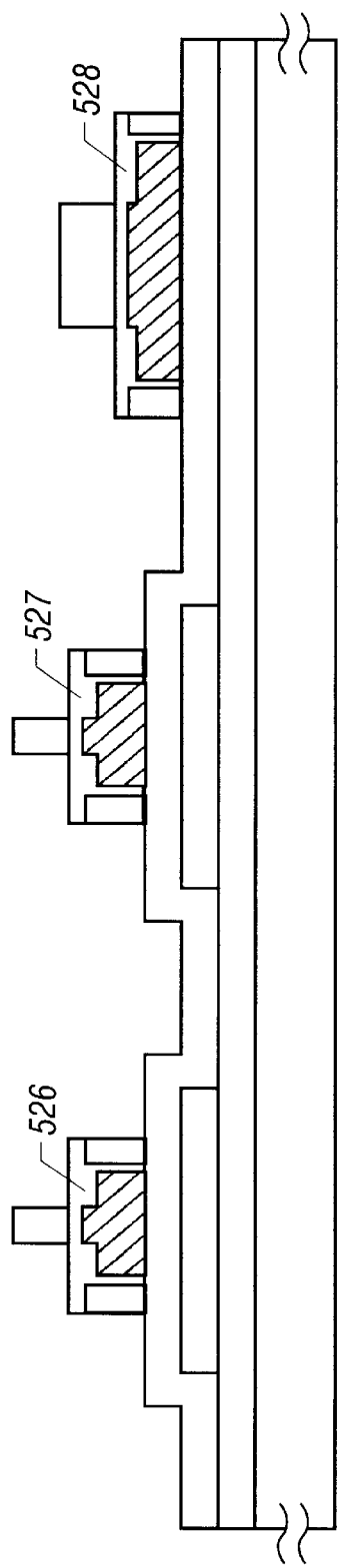

As shown in FIG. 4F, formation of dense anode oxide films is again performed with lead 524 being also used as the anodization current supply lead, forming dense anode oxide films 526, 527 on respective gate electrodes 520, 522 except for the central portion that underlies its corresponding narrow mask 517, 518 on each gate. A dense anode oxide film 528 is formed simultaneously on the top surface of lead 524 per se in a similar manner. Anode oxide films 526, 527 measure 70 nm in thickness, and protect the surfaces of gate electrodes 520, 522 suppressing occurrence of any undesirable interlayer shortcircuit and crosstalk. Note here that each of the additionally formed anode oxide films 526–528 is integral with a corresponding one of the preformed anode oxide films 511–513 as shown in FIG. 4F. Resultant integral anode oxide films serve as protective layers for the top surfaces of gate electrodes 520, 522 and lead 524; they also act to eliminate or minimize occurrence of unwanted hillocks and/or whiskers. Especially, these have a function of enhancing the irradiation withstanding characteristics of aluminum during laser-beam irradiation process to be later performed, thereby eliminating melting of aluminum and partial scattering or "fly-loss" of aluminum otherwise occurring when "bare" aluminum islands are irradiated with a laser beam. Very importantly, no additional anode oxide films having dense film quality are formed at specific portions whereat mask segments 517–519 reside. This is due to the fact that any electrolytic solution used can no longer enter or "invade" such portions as blocked by masks 517–519.

Figure 4G:
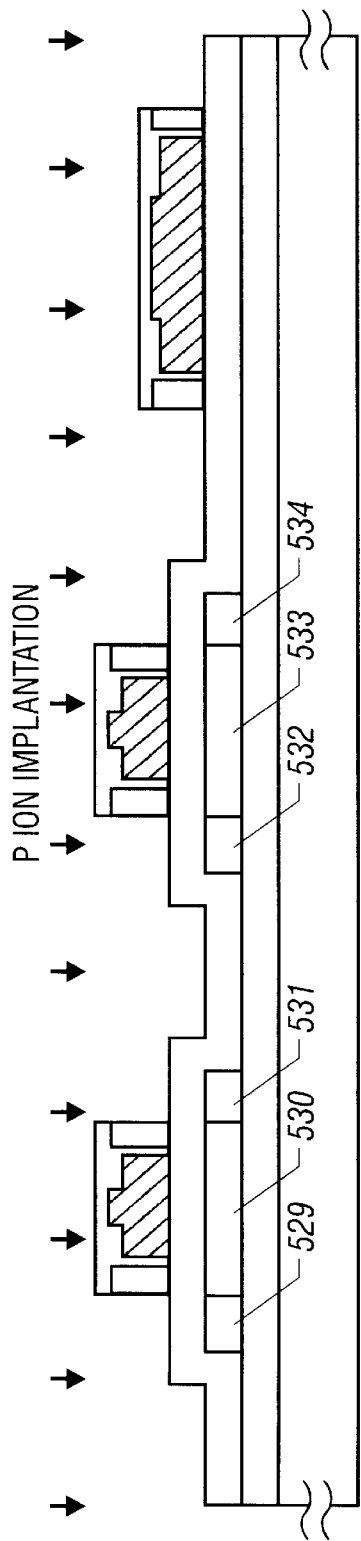

The structure of FIG. 4F is then doped by ion-implantation with N-type impurity such as phosphorus (P), forming several heavily-doped N type ($N^+$ type) impurity regions 529, 531, 532, 534 in the TFT active layers 503, 504 while eliminating such impurity doping at the central region 530, 533 of each active layer which underlies its associated gate electrode structure as shown in FIG. 4G. After completion of ion implantation for impurity doping, the porous side-wall anode oxides 521, 523, 525 are removed away as shown in FIG. 4H.

The structure of FIG. 4H is again doped with the N-type impurity, phosphorus (P), at certain charge dose which is less than that of the prior impurity doping at the step of FIG. 4G, thereby forming lightly-doped N type ($N^-$ type) regions 535, 537, 538, 540 in the TFT active layers 503, 504. More specifically, $N^-$ type regions 535, 537 are defined to be self-aligned with its overlying gate electrode at the inner edge locations of spaced-apart $N^+$ type regions 529, 531 in active layer 503, with an intermediate channel formation region 536 being laid therebetween; $N^-$ type regions 538, 540 are at the inner edges of $N^+$ type regions 532, 534 in active layer 504 with a channel region 539 defined therebetween in a similar manner. Simultaneously, offset gate regions are also formed in the active layers in such a manner that these are equal in width to the thickness of the vertical side-wall portions of the dense anode oxide films 526–528 on the opposite sides of gate electrodes 520, 522: Such offset gates are not visible in FIG. 4H because films 526–528 are as small as 100 nm in thickness.

Figure 4H:
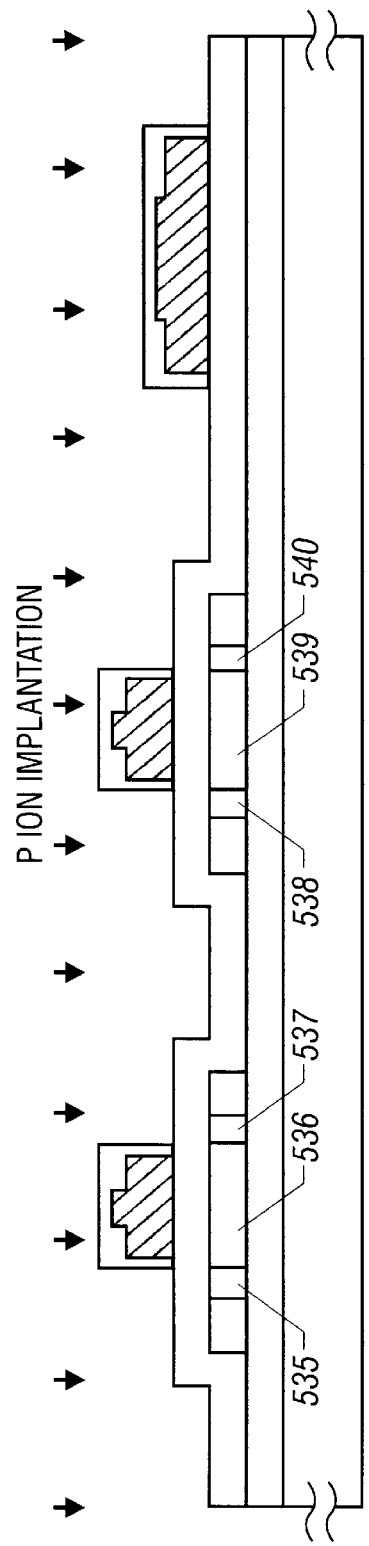
Figure 4I:
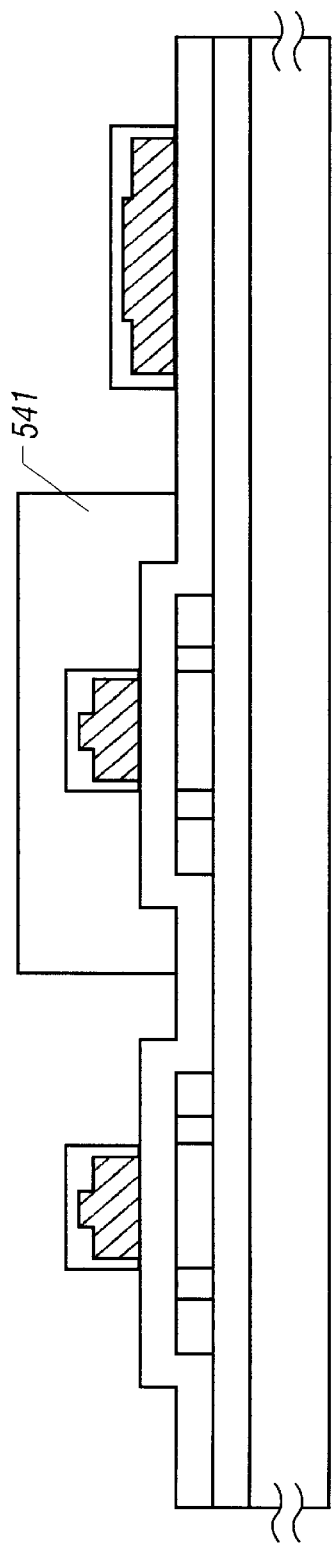

After completion of the second N-type impurity doping, a patterned resist mask 541 is deposited on resultant structure as shown in FIG. 4I. Mask 541 selectively covers only part of the NTFT structure as shown.

Then, the structure of FIG. 4I is doped by ion implantation with chosen P-type impurity—here, boron (B)—at carefully designed charge dose, causing $N^-$ type impurity regions 535, 537 of FIG. 4H to change in conductivity type to P type ones 543, 545. These P type regions 543, 545 function as the source and drain of PTFT. Outer regions 542, 546 thereof at the opposite edge portions of active layer 503 may simply act as electrode pads.

Figure 4J:
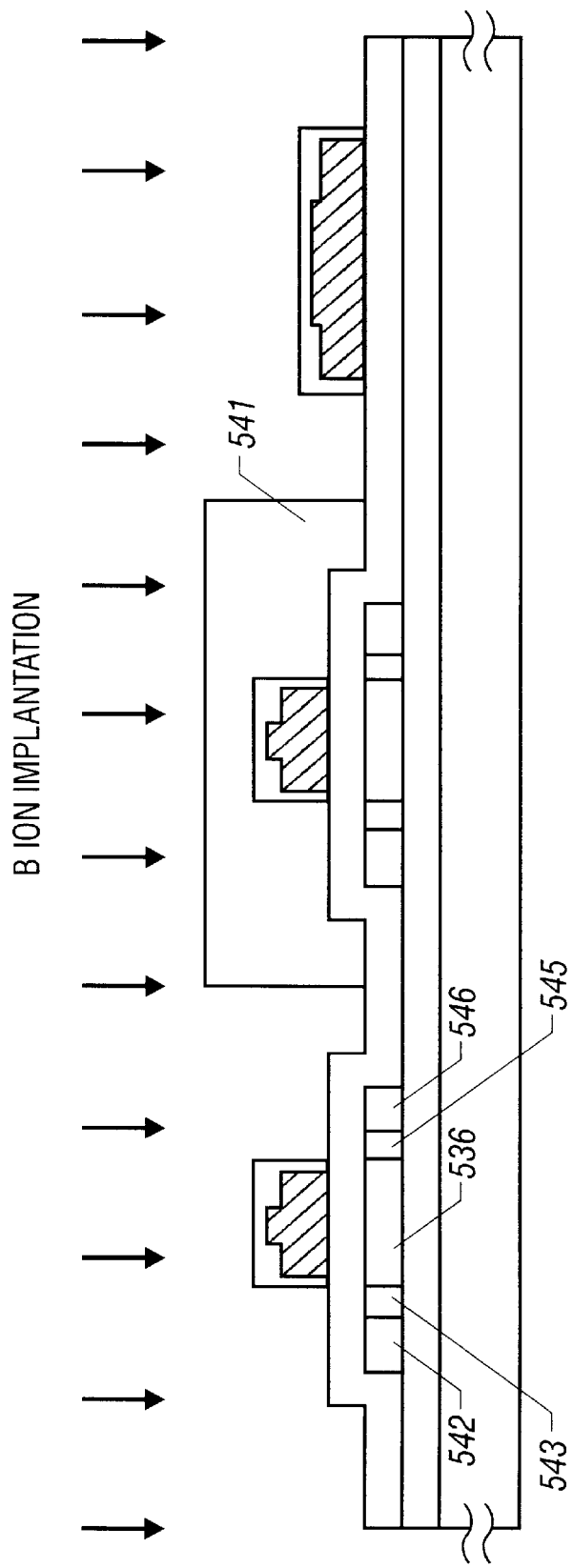

After the mask 541 of FIG. 4J is removed, resultant structure is then irradiated with laser light for activation of the doped impurity as well as curing any damaged film portions due to impurity ion implantation.

Figure 4K:
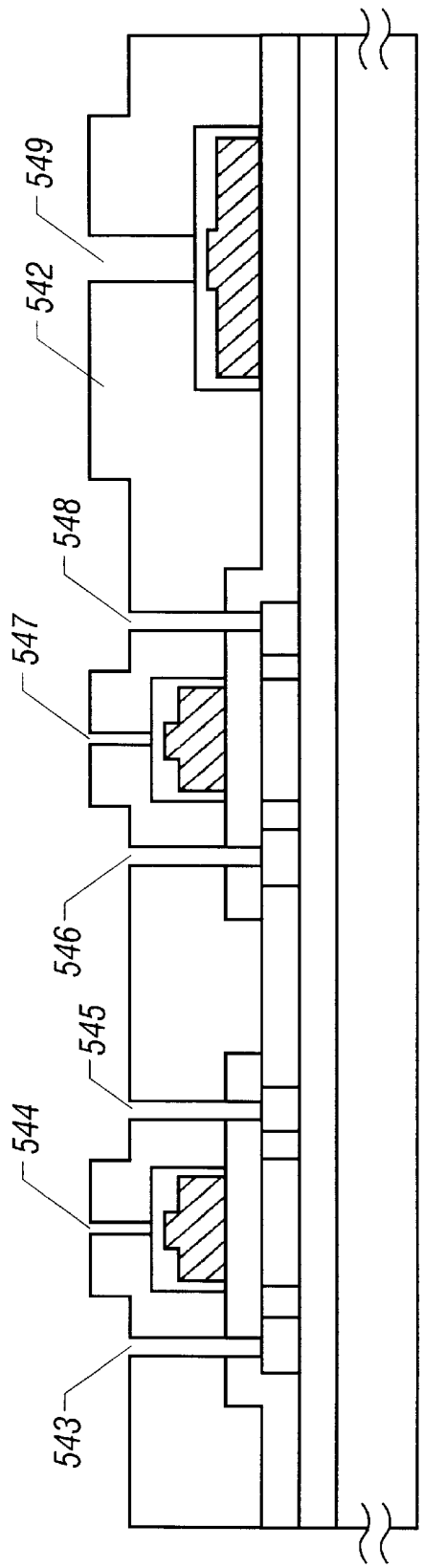
Figure 4L:
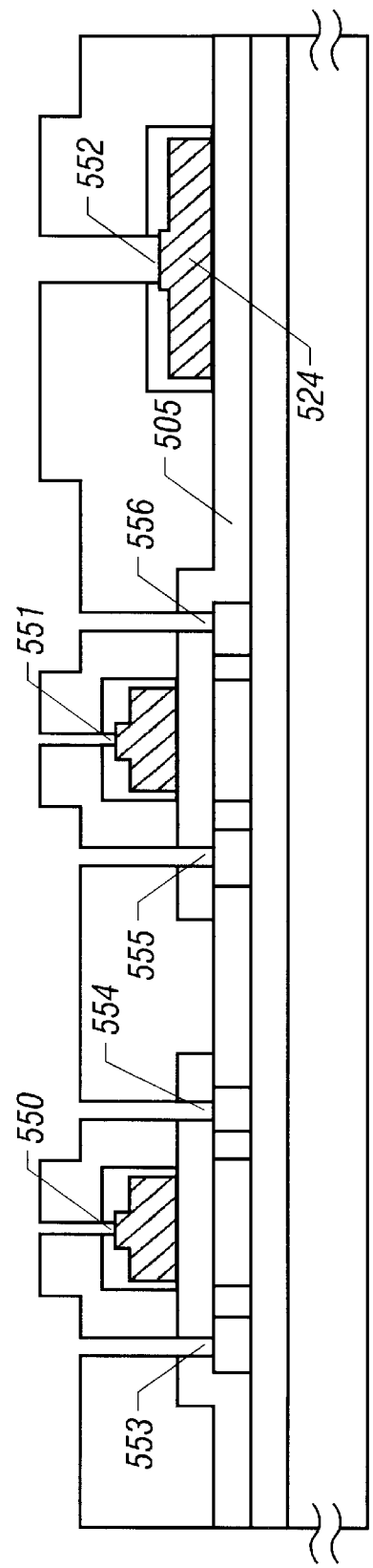

Next, as shown in FIG. 4K, a dielectric layer 542 is deposited by plasma CVD techniques to a thickness of 600 nm on the entire surface of resultant structure. Layer 542 is provided as an interlayer insulation film, which may be made of silicon oxide or its equivalents. Etching is then performed to define vertical openings 543–549 in interlayer insulation film 542 at selected locations as shown. In this case the etching process is forced to further progress even after formation of openings 543–549, removing selected portions 550–556 of the underlying silicon oxide film 505 and anode oxide films 526–528 as shown in FIG. 4L. More specifically, for the TFT sections, silicon oxide film 505 is selectively etched away at locations 553–556 elongated from corresponding openings 543, 545, 546, 548; at locations 550–552, dense anode oxide films 526–528 overlying the gate electrodes 520, 522 and lead 524 are selectively etched out defining holes as extended from corresponding openings 544, 547, 549. During this process, since such films 526–528 are partially decreased in thickness at the selected locations 550–552 for contact hole formation to be 10 to 15 nm thick, partial removal of films 526–528 may be facilitated while removing selected portions of silicon oxide film 505 simultaneously. In this way, formation of required contact holes for respective TFTs and associated lead wire section is completed as shown in FIG. 4L. Note here that a contact hole consisting of continuous openings 549, 552 is for use in separation or interruption of lead 524 at a later step of fabrication.

Then, as shown in FIG. 4M, a metallic thin film 557 is formed by sputtering on the structure of FIG. 4L to fill the contact holes. Metal 557 may be a lamination of titanium, aluminum and titanium films in this order.

As shown in FIG. 4N, the metal 557 is then patterned forming a desired pattern of electrodes and associative lead wires, including a source electrode 558, gate connection pad 559 and drain electrode 560 for the PTFT section, and also including a source electrode 563, gate pad 562 and drain electrode 561 for the NTFT. At this step the lead 524 is locally cut away by additionally defining therein a separation opening 565 at a specific location beneath the opening 564. This is done by forcing the etching reaction to further continue from the patterning of metal 557. This results in formation of both the PTFT and NTFT at a time while simultaneously permitting execution of separation or cutaway of lead 524, which has been employed to supply the anodization current to the TFT gate electrodes. Finally, the structure of FIG. 4N is heated up to a temperature of 350° C. for one hour in the hydrogen atmosphere, completing CMOS structure.

With the illustrative embodiment shown in FIGS. 4A–4N, the NTFT alone comes with the N⁻ type impurity-doped regions 538, 540 in active layer 504, one of which regions at the drain side—namely, region 538—constitutes the LDD structure. The LDD structure is advantageous in suppressing or eliminating any possible degradation of TFT characteristics due to injection of hot carriers (typically, hot electrons) while simultaneously reducing the turn-off current in value. In addition to this, increasing the source-to-drain resistivity may cause the carrier mobility to decrease successfully. It is readily recognized by one of ordinary skill in the semiconductor art that PTFTs remain less in mobility than NTFTs, which in turn leads to the fact that PTFTs are free from deterioration due to hot carriers in general aspects. In view of the foregoing, employing the LDD structure only for NTFTs to lower the mobility and minimizing degradation due to hot carriers may advantageously serve to compensate for any possible differences or deviations in characteristic between PTFTs and NTFTs. This will especially be advantageous where PTFTs and NTFTs are formed by microelectronics fabrication techniques on a single substrate to attain CMOS structure.

Figure 5A:
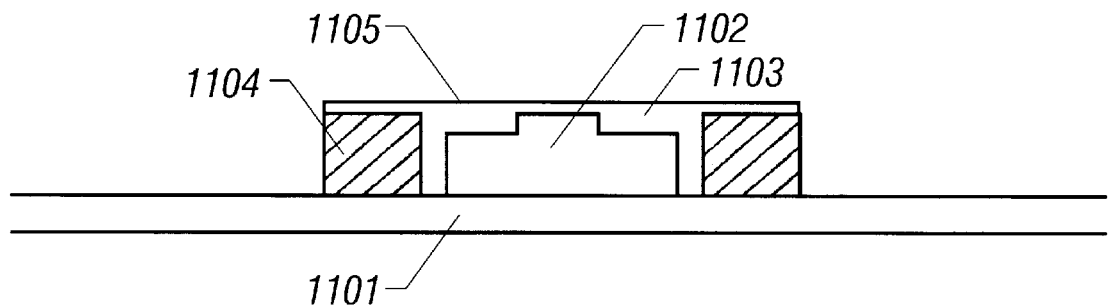
FIGS. 5A to 5C depict in cross-section some of major steps of anodization with a gate electrode as an anode therefor.
Figure 5B:
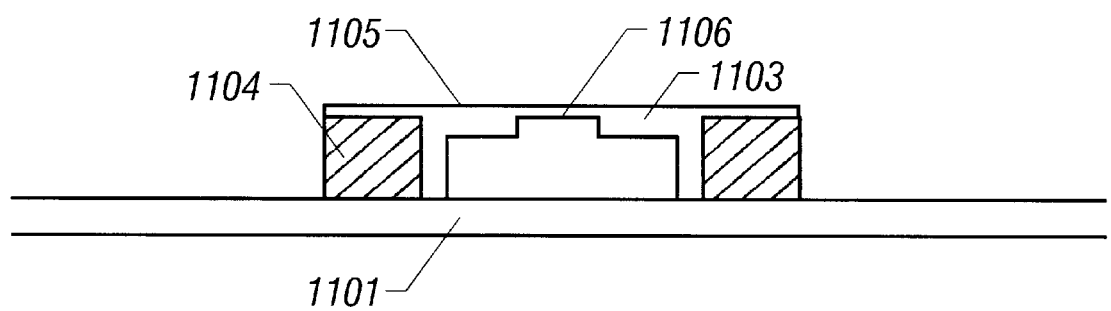
Figure 5C:
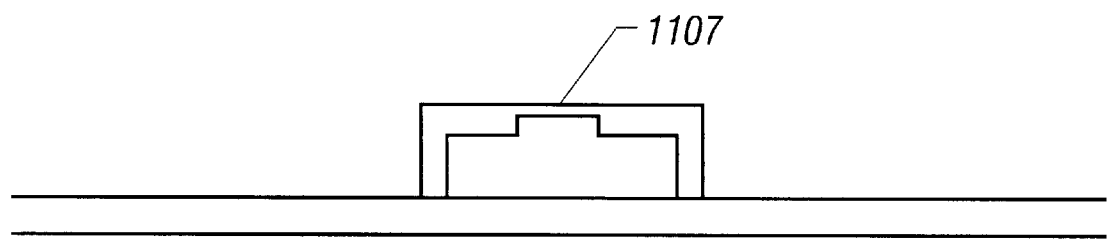
Figure 6A:
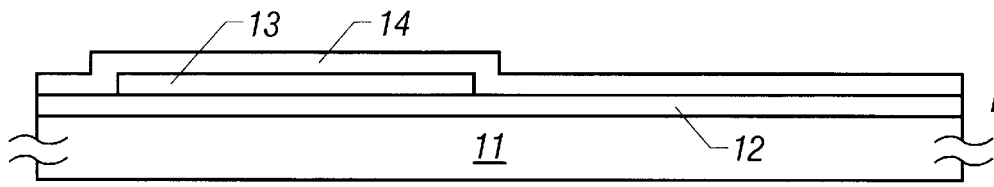
FIGS. 6A to 6E show in cross-section some of major steps of manufacture of a semiconductor device in the prior art.
Figure 6B:
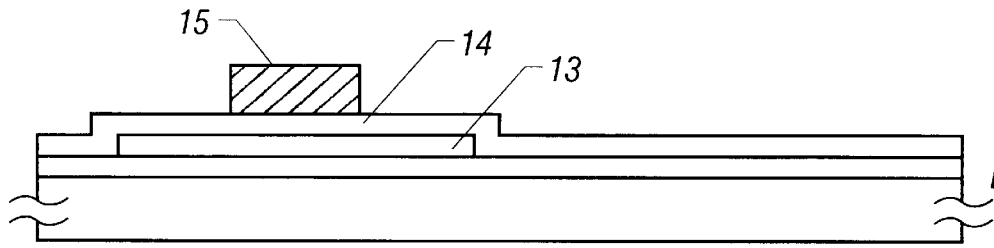
Figure 6C:
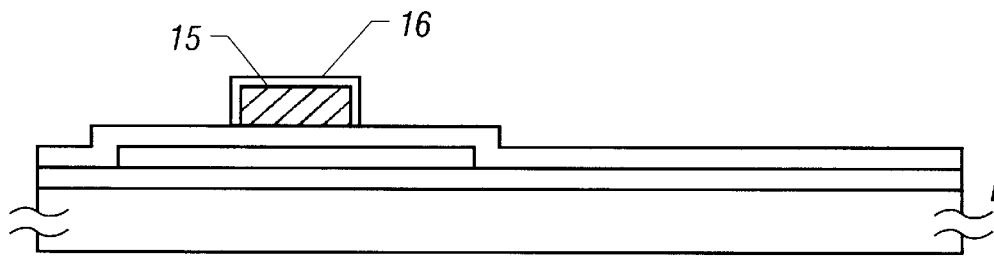
Figure 6D:
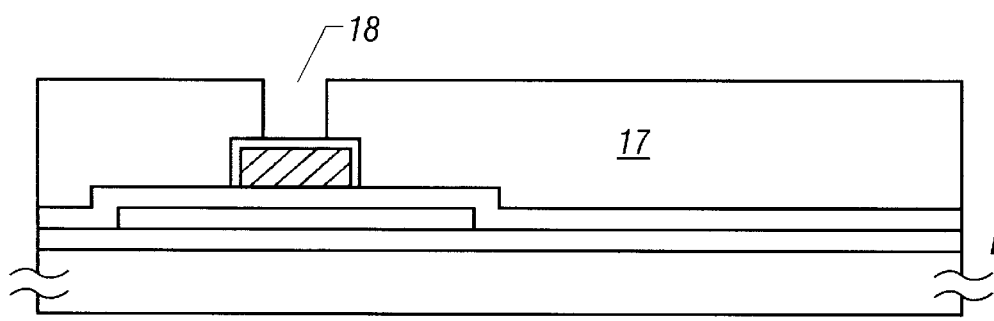
Figure 6E:
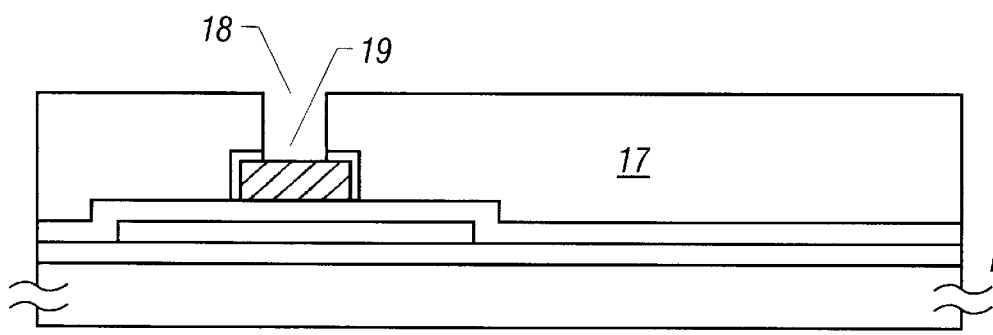

A TFT fabrication method in accordance with a further embodiment of the invention is shown in FIGS. 5A to 5C. One important concept of this embodiment lies in avoiding a problem which can arise at the steps of FIGS. 4G and 4H: When the porous side-wall anode oxides 521, 523 are removed away, the extra-thin, dense anode oxide films 511–513 overlying the surfaces of respective aluminum islands (gate electrodes 520, 522 and lead 524) can be removed together. While this depends upon the conditions as employed, films 511, 512 tend to be at least partially peeled off from gate electrodes 520, 522 during removal of porous side-wall anode oxides 521, 523. One possible approach to avoid such problem is that removal of side-wall oxides 521, 523 is done while forcing the resist mask segments 517, 518 of FIG. 4D to continuously reside on the structure of FIG. 4G. However, this does not come without accompanying a penalty that follows: Removal of masks 517, 518 becomes difficult at later steps depending upon the materials used for such masks as well as ion implantation conditions designed. Fortunately, the above problem can be successfully avoided by the illustrative embodiment as will be discussed below.

See FIG. 5A. This depicts a cross-section of a TFT structure under manufacture, which may correspond to one TFT shown in FIG. 4D with the narrow resist mask segment 517 being removed away. More specifically, a gate insulation film 1101 is deposited on the top surface of a substrate (not shown here). A patterned gate electrode 1102 made of aluminum is formed on film 1101. Gate electrode 1102 has on its top and side-wall surfaces dense anode oxide films 1103, 1105 as integral with each other, and also has on its opposite side walls porous anode oxides 1104 as shown. Dense anode oxide film 1105 which is extra thin and has been first formed on the top of gate electrode 1102 is integral with dense anode oxide portions at the opposite side walls of gate electrode 1102.

Then, another dense anode oxide film 1106 is additionally formed on the top surface of gate electrode 1102 as shown in FIG. 5B. Formation of film 1106 may be substantially the same in condition as the step of forming films 1103, 1105. The thickness of film 1106 is carefully designed to ensure that it is identical to an estimated thickness of film 1105 which will possibly be etched away during removal of porous side-wall oxides 1104. In other words, any possible decrease in thickness of film 1105 when removal of oxides 1104 is compensated for by additional formation of film 1106 thereon.

Next, as shown in FIG. 5C, porous side-wall oxides 1104 are etched away. After removal of such oxides, a dense anode oxide film section 1107 of an intended thickness is capable of residing on the top surface of gate electrode 1102. This prevents unwanted exposure of gate-electrode aluminum island 1102 at the top surface thereof.

Figure 7A:
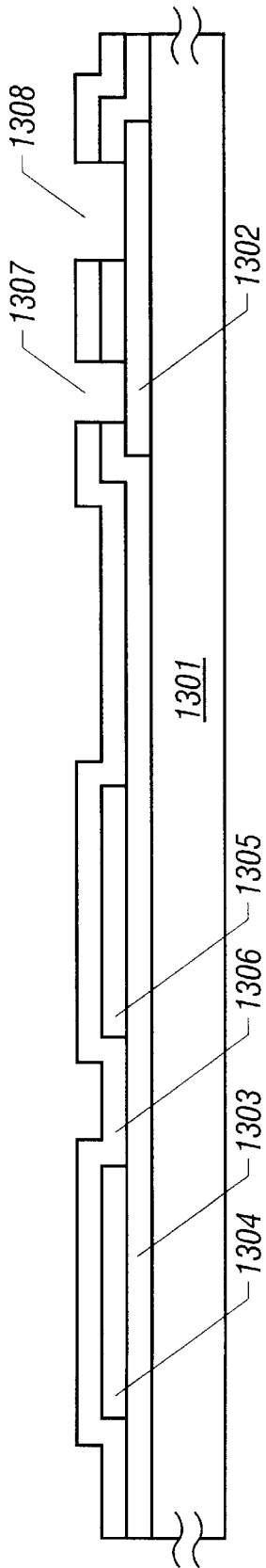
FIGS. 7A to 7N illustrate in cross-section some of major steps of fabrication of a semiconductor device having P- and N-channel type TFTs on a single substrate in accordance with a further embodiment of the invention.

A CMOS fabrication method also embodying the invention is shown in FIGS. 7A through 7N. This embodiment is preferably used in the manufacture of CMOS-TFT structures which eliminate use of aluminum for pads, including test terminals, electrical connection pads with external LSI chips and the like.

FIG. 7A assumes use of a glass substrate 1301 having a top surface on which TFTs of selected channel conductivity types are to be formed along with associative pad terminals—these include a PTFT at the left-hand location, an NTFT at the center, and a lead pad section for electrical interconnections of the TFT gate electrodes at the right-hand location for purposes of illustration only.

First formed on the substrate 1301 is a metallic film which offers high thermal or heat resistance as well as enhanced acid resistivity. The metal film may be tantalum (Ta). This Ta film is patterned forming a lead pad 1302 on substrate 1301. A primary coat film 1303 is deposited to a predetermined thickness, for example, 300 nm. Coat 1303 may be made of silicon oxide. An amorphous silicon film (not shown) is then formed to a thickness of 50 nm, which film acts as a starter film for crystallization of amorphous silicon to provide the active layers of TFTs. The amorphous silicon film is crystallized by known thermal or laser irradiation techniques providing a crystalline silicon film (not shown), which is then patterned forming active layers 1304, 1305 of the NTFT and PTFT, respectively. A silicon oxide film 1306 is formed by plasma CVD techniques to a thickness of 100 nm on the resulting structure. Film 1306 will act as the gate insulation film for each TFT. Selected portions of the lamination of coat 1303 and dielectric film 1306 overlying lead pad 1302 are etched away defining therein contact holes 1307, 1308. Contact hole 1307 will serve to provide a contact for permitting electrical interconnections between the gate electrodes and associated nodes or terminals; contact hole 1308 is for providing an external contact pad for electrical connection to one or several external chip package leads as operatively associated therewith. The etching process may typically employ buffered-hydrofluoric acid; accordingly, lead section 1302 is made of tantalum which is one of preferable materials that offer enhanced acid resistivity.

Figure 7B:
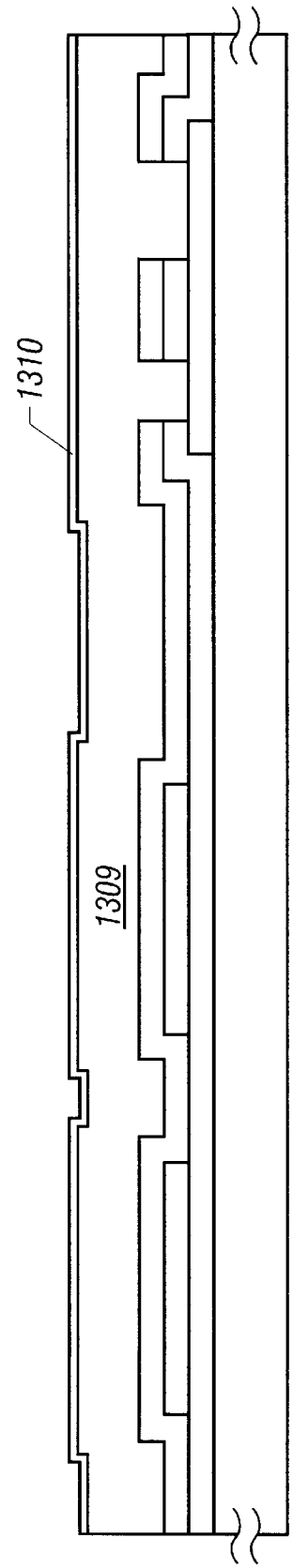

Then, an aluminum film 1309 is deposited by sputtering to a thickness, such as 400 nm, as shown in FIG. 7B. Film 1309 is for constituting the TFT gate electrodes after patterning as will be later described. This aluminum film contains scandium at 0.1 weight percent (wt %), for minimizing or eliminating occurrence of hillocks or whiskers therein. A dense anode oxide film 1310 of 5 to 10 nm thick is formed on the entire surface of film 1309.

Figure 7C:
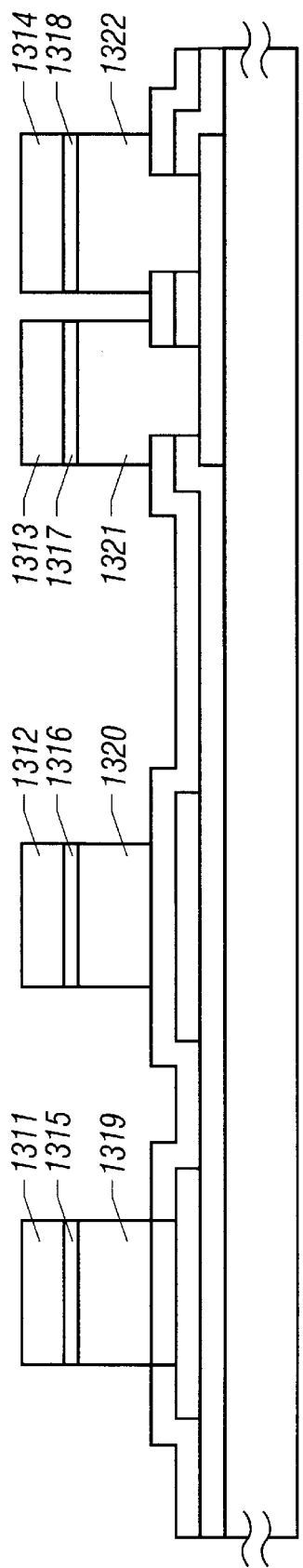

Then, as shown in FIG. 7C, patterned resist mask segments 1311–1314 are formed on the top surface of resultant structure, for use in patterning film 1309 to define TFT gate electrodes therein. Presence of dense anode oxide film 1310 between aluminum film 1309 and masks 1311–1314 serves to enhance adhesionability therebetween. With masks 1311–1314 used, the underlying films 1309, 1310 are patterned by etching process thereby forming several spaced-apart patterned islands: an aluminum island 1319 acting as the gate electrode of an NTFT, island 1320 as that of PTFT, island 1321 as a gate lead wire for electrical interconnection with associated terminal(s), and island 1322 as a pad protector as shown in FIG. 7C. Islands 1319–1322 have on the top surface thereof correspondingly patterned anode oxide film segments 1315–1318 respectively as shown.

Figure 7D:
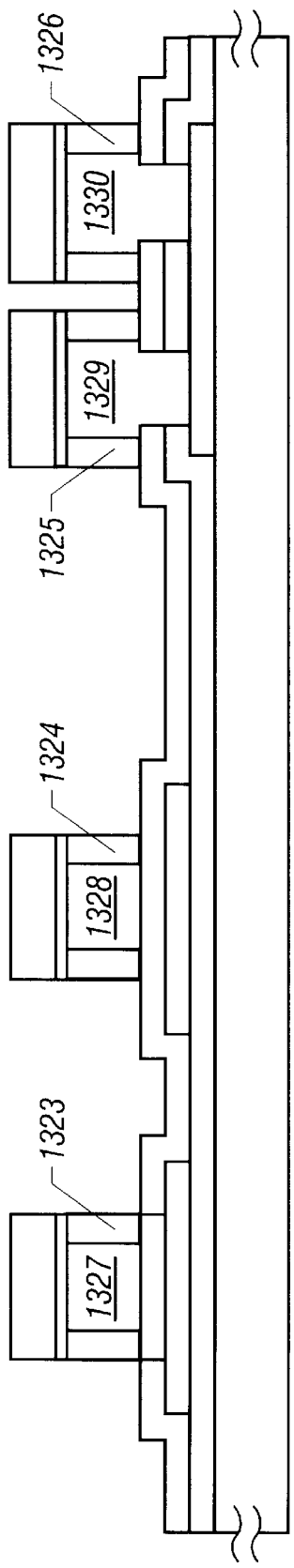

Next, as shown in FIG. 7D, porous anode oxides 1323–1326 are formed on the opposite side walls of respective aluminum islands, which are herein indicated by numerals 1327–1330. No porous anode oxides are formed on the top surfaces of islands 1327–1330 due to the presence of masks 1311–1314 and dense anode oxide films 1315–1318. As a result of this anodization process, an NTFT gate electrode 1327 and a PTFT gate electrode 1328 are fabricated insulatively overlying the active layers 1304, 1305 respectively.

Figure 7E:
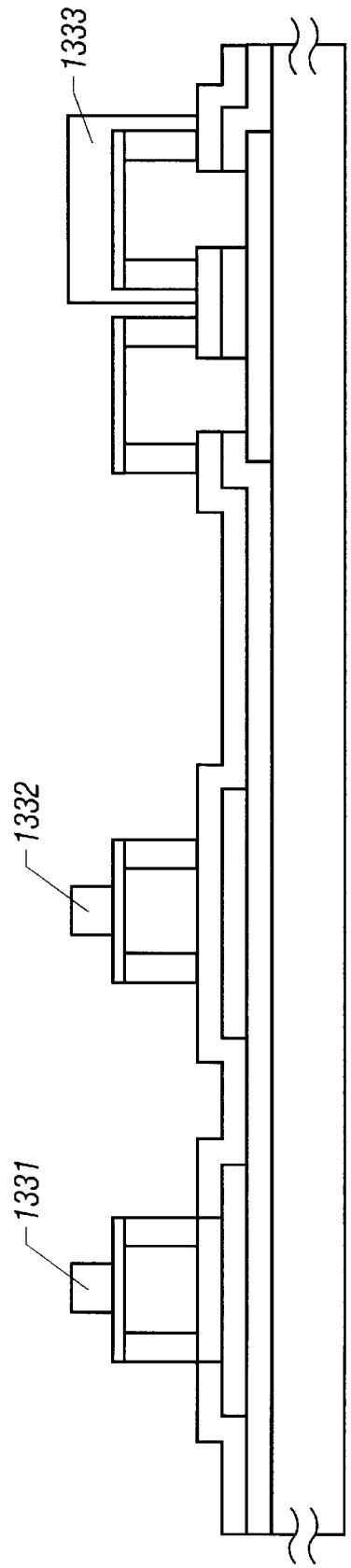

Then, as shown in FIG. 7E, the resist mask segments 1311–1314 are removed away; thereafter, new patterned resist mask segments 1331–1333 are deposited instead. The first two masks 1331, 1332 are for determination of exact locations whereat gate contact holes are to be defined. More specifically, the locations of these two masks are eliminated from additionally forming of any dense anode oxide films at a later step of manufacture, for successful definition of corresponding contact holes therein. The remaining mask 1333 is for protecting aluminum island 1330 against anodization reaction, which will in turn lead to facilitation of later removal of this aluminum island.

Figure 7F:
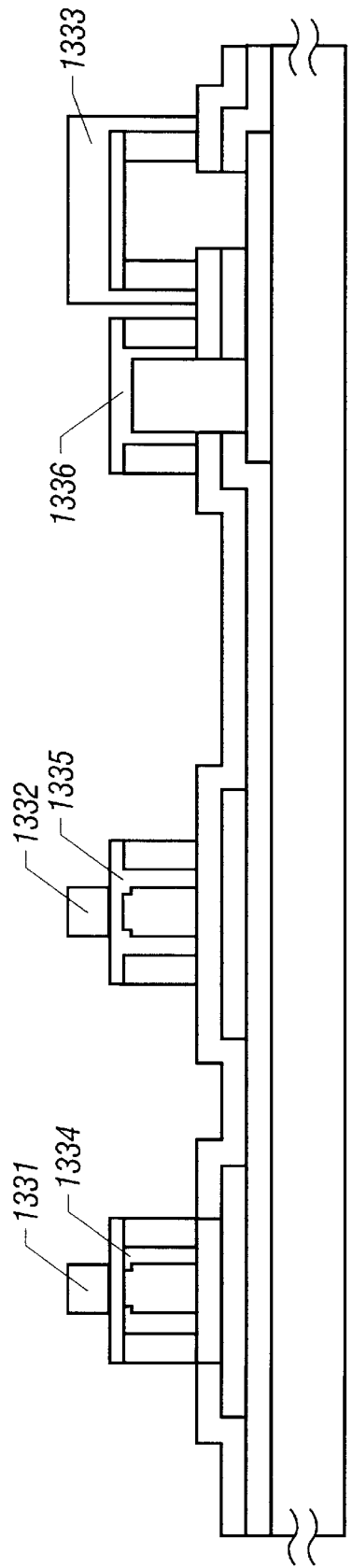

Anodization is again carried out forming dense anode oxide films 1334–1336 on respective aluminum island top surfaces as shown in FIG. 7F. These films 1334–1336 measure 100 nm in thickness. Films 1334–1336 each function as a protective layer covering the surfaces of gate electrodes 1327–1329 for suppressing occurrence of electrical interlayer shortcircuit and crosstalk. Anode oxide films 1334–1336 are integral with those 1315–1317. These anode oxide films also function to physically protect the associated surfaces of aluminum islands against excessive heat application during a later thermal treatment(s), thus preventing hillocks and/or whiskers from taking place therein. Especially, during a laser irradiation step, such films act to provide aluminum with enhanced laser resistivity. At the step of FIG. 7F, no dense anode oxide films are formed at certain locations whereat resist masks 1331–1333 are placed. This is because electrolytic solution used can no longer invade such portions.

Figure 7G:
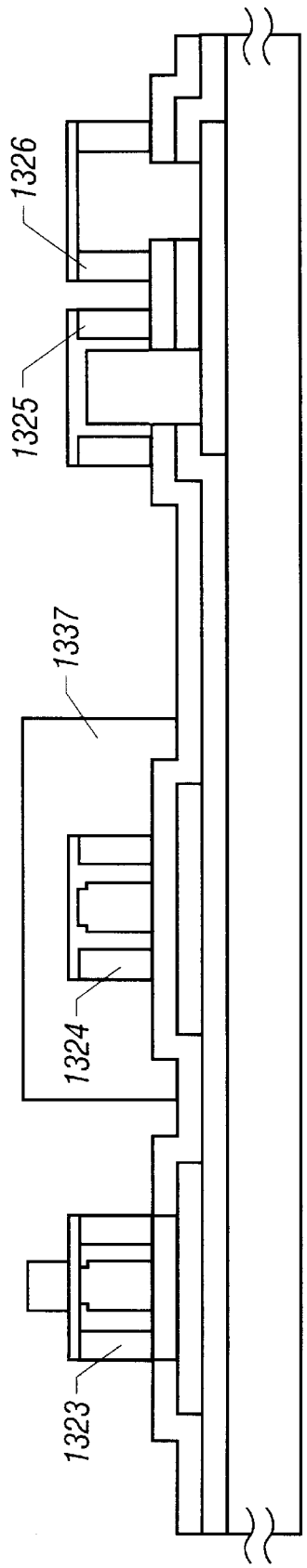
Figure 7H:
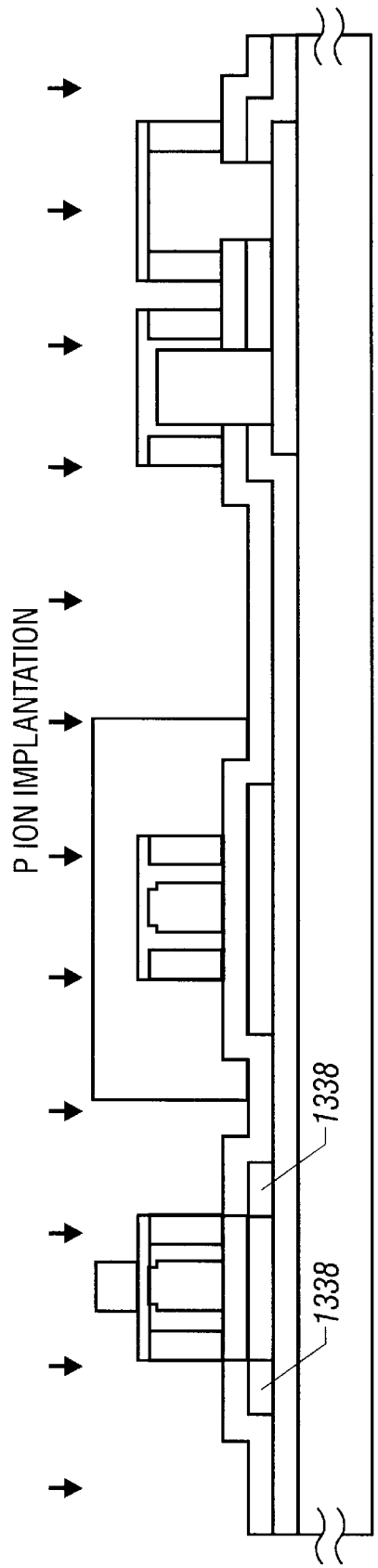

After completion of the structure of FIG. 7F, the masks 1331–1333 are removed away. Then, another patterned resist mask 1337 is selectively formed at a specified location, which covers only the NTFT section as shown in FIG. 7G. Resultant structure is then doped with N-type impurity (here, phosphorus ions) defining spaced-apart heavily-doped regions 1338 of $N^+$ type conductivity in the active layer 1304 as the source and drain of an intended PTFT, as shown in FIG. 7H.

Figure 7I:
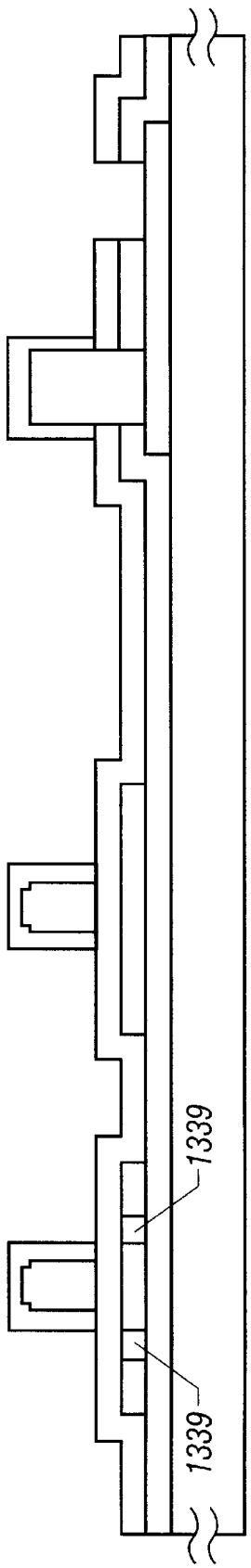

After completion of the above impurity doping, the resist mask 1337 is removed away together with the porous side-wall anode oxides 1323–1326, which may be etched away using phosphoric-acid based etchant. Simultaneously, both extra-thin anode oxide protective film 1318 and aluminum island 1330 may be removed at a time. This can be done since any dense anode oxide film of 100-nm thick did not be formed on such portion 1330 at the step of FIG. 7E. Removal of porous anode oxides results in the structure of FIG. 7I, which includes offset regions 1339 at inner edges of spaced apart source and drain regions 1338 in active layer 1304.

Figure 7J:
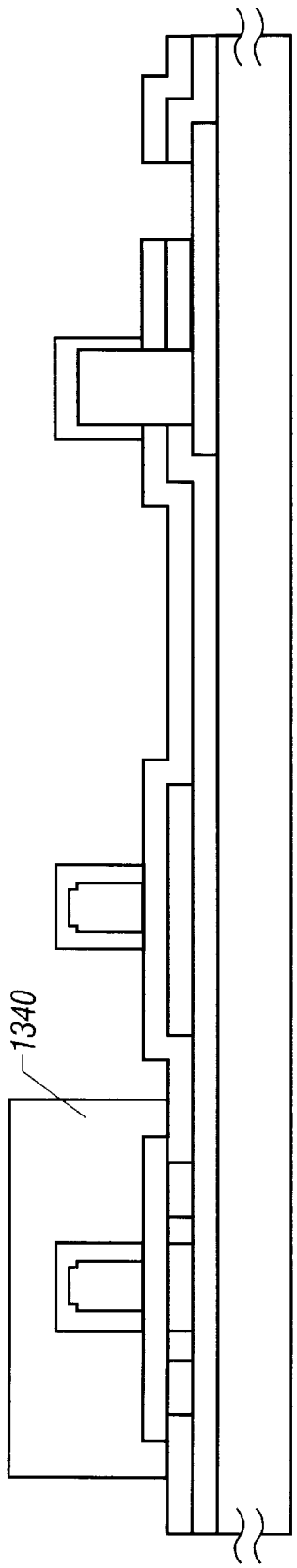
Figure 7K:
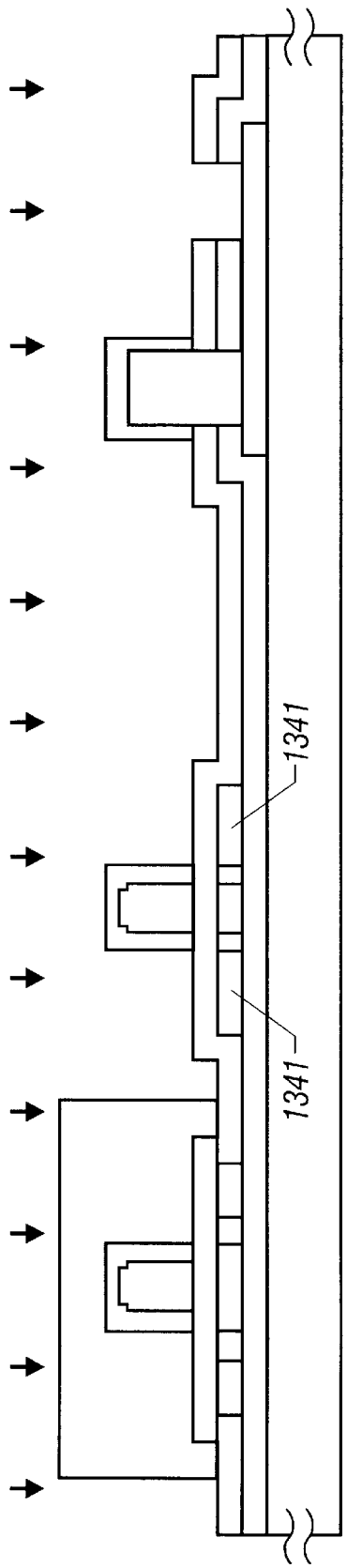

Next, as shown in FIG. 7J, a patterned resist mask 1340 is deposited exclusively covering part of resultant structure, that is, NTFT section only. The structure is then doped with chosen impurity such as boron ions to thereby define spaced-apart $P^+$ type source and drain regions 1341 in the active layer 1305. After removal of mask 1340, the structure is irradiated with a laser beam for activation of the doped impurity while simultaneously curing by annealing any damaged film materials due to execution of the impurity injection.

Figure 7L:
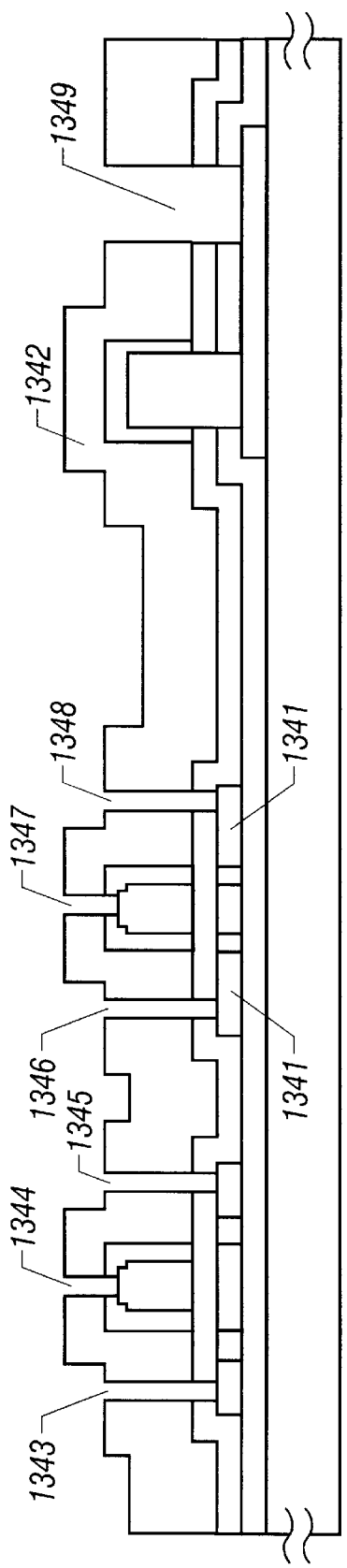

Thereafter, as shown in FIG. 7L, an interlayer dielectric film 1342 is formed by plasma CVD to a thickness of 500 nm on the top surface of resultant structure. Film 1342 may be silicon oxide. Film 1342 is patterned by etching to thereby define therein a plurality of openings 1343–1349 as contact holes. During the etching process, the dense anode oxide film has a thickness, at contact-hole formation locations, of equal to or less than 10 nm, enabling successful removal of both silicon oxide film 1342 and such dense anode oxide film portions at a time. This results in formation of a structure shown in FIG. 7L, wherein one contact hole 1349 is for causing lead pad 1302 to partly expose on its surface as shown.

Next, a metallic film 1350 is deposited on the entire surface of resultant structure as shown in FIG. 7M. Film 1350 here is a lamination of aluminum and titanium films, which may be formed by sputtering techniques. Metal film 1350 is then patterned forming respective electrodes and lead wires associated therewith for electrical interconnection, which include a source electrode 1351, gate connection pad 1352 and drain electrode 1353 for the NTFT; a source electrode 1356, gate pad 1355 and drain electrode 1354 for PTFT. At this step the metal film 1350 is removed allowing the underlying terminal pad 1302 to partly expose on its surface as shown in FIG. 7N. In this way, an intended CMOS structure including both the PTFT and NTFT on the same substrate can be completed along with any required lead pads that include test terminals and electrical connection nodes or terminals with external LSIs as operatively coupled thereto. Very importantly, employing the prescribed lead pad structure results in a decrease in failure, such as peel-off, increasing reliability while reducing complexity and cost for manufacture. Furthermore, where the illustrative lead pad structure is for use as a test terminal, physical strength for contact with a probe pin can be enhanced enabling achievement of stable electrical contact therebetween, which in turn leads to an increase in reliability of test procedure.

Figure 8:
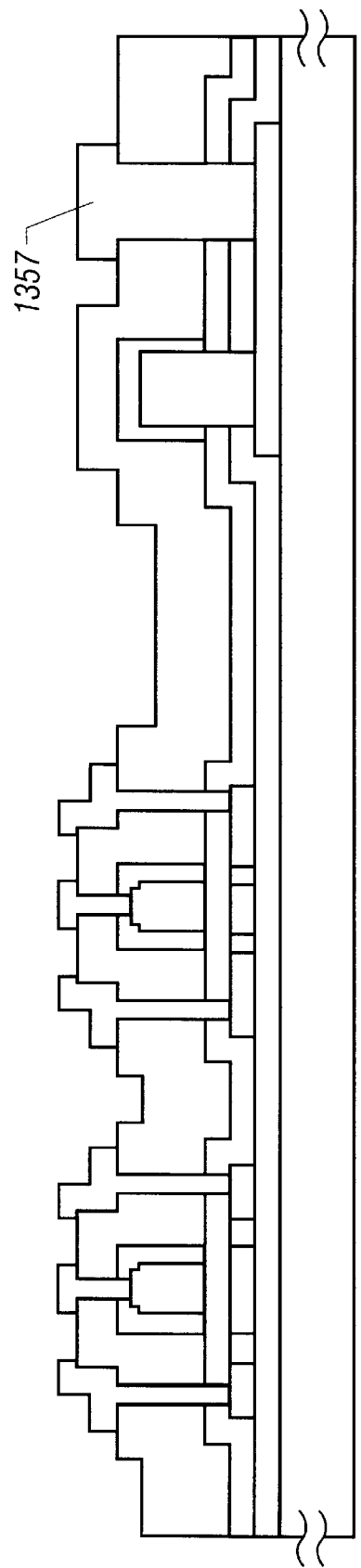
FIG. 8 depicts a cross-sectional structure of a CMOSTFT IC structure in accordance with a further embodiment of the invention.

While the CMOS structure as fabricated using the above embodiment method of FIGS. 7A–7N assumes use of a single-layered structure for the lead pad 1302 made of tantalum (Ta), such pad may alternatively have a multilayered structure consisting of aluminum (Al), titanium (Ti) and tantalum (Ta) films with the Ta film underlying the Al/Ti film lamination. To fabricate such three-layered lead pad structure, as shown in FIG. 8, a lamination of Al/Ti films is formed on a Ta lead pad; then; resultant multilayered section is patterned forming three-layered pad section 1357. This pad 1357 is preferably adapted for use as a test terminal or a connection pad to be electrically coupled to an external LSI chip(s) operatively associated therewith.

It is seen from the above that the process for forming TFT structures embodying the present invention is capable of avoiding difficulties otherwise occurring when formation of contact holes extending through an anode oxide film(s), while simultaneously facilitating later separation or cut-away process of a lead wire(s) for supply of anodization current with complexity being reduced. More specifically, technical advantages of the invention are listed up as follows:

(1) Allowing the individual TFT gate electrode and its associated leads extending therefrom to be comprised of aluminum with electrical resistivity minimized.

(2) Enhancing thermal resistivity of aluminum by forming an anode oxide film(s) as the protective layer thereof.

(3) Reducing or avoiding difficulties as to formation of contact holes with respect to the anode oxide film(s).

(4) Successfully executing a cut-away process for any anodization-current supply leads being used during fabrication of anode oxides or anode oxide films without the need to add extra steps of manufacture therefor.

A key feature of the present invention lies in the capability of simultaneous achievement of the above items (2) and (3).

Having thus described particular embodiments of the invention, various alterations and modifications as well as improvements will readily occur to those skilled in the art. Such alterations, modifications and improvements are intended to be part of this disclosure, and are intended to be within the spirit and scope of the invention. Accordingly, the foregoing description is by way of example only and is not intended as limiting. The invention is limited only as defined in the appended claims and the equivalents thereto.

What is claimed is:

1. A method of forming a semiconductor device comprising the steps of:

performing anodization with a mask disposed on part of at least one of a lead wire and an electrode made of an anodizable material; and forming by use of said part underlying said mask a contact hole above at least one of said lead wire and said electrode while permitting separation of at least one of said lead wire and said electrode.

2. A method according to claim 1, wherein said anodizable material comprises a chosen material containing therein aluminum or using aluminum as its main component.

3. A method according to claim 1, wherein the anodization results in formation of an anode oxide film with dense film quality.

4. A method of manufacturing a semiconductor device comprising the steps of:

forming a film of an anodizable material;

forming an anode oxide film on said film;

disposing a first mask on said anode oxide film;

forming by use of said mask a predefined lead wire and/or electrode;

removing said first mask;

disposing a second mask on part of said lead wire and/or electrode thereby performing anodization; and forming a contact hole for interconnection with at least one of said lead wire and said electrode by use of the part underlying said second mask while simultaneously permitting separation of said lead wire and said electrode.

5. A method according to claim 4, wherein said anodizable material comprises a chosen material containing therein aluminum or using aluminum as its main component.

6. A method according to claim 4, wherein the anodization results in formation of an anode oxide film with dense film quality.

7. A method of manufacturing a semiconductor device comprising the steps of:

forming a pattern of anodizable material having a partly thin anode oxide film being formed on a surface thereof; and simultaneously performing formation of a contact and separation of said pattern by use of the thin portion of said anode oxide film.

8. A method according to claim 7, wherein said anodizable material comprises a chosen material containing therein aluminum or using aluminum as its main component.

9. A method of forming a semiconductor device comprising the steps of:

disposing a plurality of masks on a surface of a first lead and/or electrode being made of aluminum or containing therein aluminum as its main component;

performing anodization with said first lead and/or electrode being as an anode;

removing said masks;

forming an interlayer dielectric film overlying said first lead and/or electrode;

forming openings in said interlayer dielectric film at locations of said masks thereby partly exposing said first lead and/or electrode;

forming a metallic film on said interlayer dielectric film;

patterning said metallic film causing part thereof to reside in at least one portion subject to formation of said openings to thereby form a second lead and/or electrode as contacted with said first lead and/or electrode; and simultaneously performing removal of said metallic film and removal of said first lead and/or electrode at at least one of remaining portions subject to formation of said openings during the prior step of patterning said metallic film, thereby attaining separation of said first lead and/or electrode thereat.

10. A method according to claim 9, wherein said masks overlie an anode oxide film less in thickness than an anode oxide film to be formed in a later step.

11. A method according to claim 9, wherein the anodization results in formation of an anodic oxide film having dense film quality.

* * * * *